United States Patent

Inogai

[11] Patent Number: 5,848,100
[45] Date of Patent: Dec. 8, 1998

[54] FREQUENCY CONVERSION AND MODULATION CIRCUITS

[75] Inventor: Kazunori Inogai, Yokohama, Japan

[73] Assignee: Matsushita Electric Industrial Co., Ltd., Osaka, Japan

[21] Appl. No.: 653,841

[22] Filed: May 28, 1996

[51] Int. Cl.⁶ .................................................. H03H 7/30
[52] U.S. Cl. .......................................... 375/229; 375/295
[58] Field of Search .................................... 375/295, 229; 654/724.011, 724.1; 333/18, 282

[56] References Cited

U.S. PATENT DOCUMENTS

| | | | |
|---|---|---|---|
| 4,472,785 | 9/1984 | Kasuga | 364/724.1 |
| 4,694,414 | 9/1987 | Christopher | 364/724.1 |
| 4,855,894 | 8/1989 | Asahi et al. | 363/157 |
| 5,043,933 | 8/1991 | Boutaud et al. | 364/724.1 |
| 5,369,692 | 11/1994 | Nowicki | 379/171 |
| 5,408,235 | 4/1995 | Doyle et al. | 341/143 |

FOREIGN PATENT DOCUMENTS

| | | |
|---|---|---|
| 0471968 | 2/1992 | European Pat. Off. |
| 0631377 | 12/1994 | European Pat. Off. |
| 4151908 | 5/1992 | Japan . |

OTHER PUBLICATIONS

Todaka, et al, "Realization of Multirate Digital Filters with Powers-of-Two Coefficients", The Institute of Electronics, Information and Communication Engineers (IEICE), vol. J74-A, No. 9, Sep. 1991, pp. 1366–1373.

IEEE ICASSP 80 Proceedings, vol. 1 of 3, Apr. 9, 10, 11, 1980, Denver, CO (USA), pp. 271–274, XP002013588, E.B. Hogenauer, "A Class of Digital Filters for Decimation and Interpolation".

*Primary Examiner*—Tesfaldet Bocure
*Attorney, Agent, or Firm*—Stevens, Davis, Miller & Mosher, L.L.P.

[57] ABSTRACT

In a frequency conversion circuit and a modulation circuit, a filter having an impulse response (HB(z); HL(z)) corresponding to a rectangular pulse wave multiplied by a cosine wave of $f_3/4$ is a band pass type filter having a center frequency of $f_3/4$, and the transfer function H(z) of the filter is expressed in the form of a sum of series. When a numerator part of the transfer function is arranged to be processed with a low-speed sampling frequency $f_2$ and a denominator part is to be processed with a high-speed sampling frequency $f_3$ ($=L \times f_2$, L: odd number), the circuit can be made to have an adjustment-free structure and small in size. Further, when an output of processing of the numerator part based on the low-speed sampling frequency $f_2$ is subjected to a D/A conversion while processing of the denominator part based on the high-speed $f_3$ is implemented by a switched capacitor circuit, power consumption can be reduced.

6 Claims, 15 Drawing Sheets

IMPULSE RESPONSE FOR
$$H_B(z) = \frac{1 + Z^{-250}}{1 + Z^{-2}}$$

FREQUENCY-GAIN CHARACTERISTIC FOR
$H_B(z) = \dfrac{1+Z^{-250}}{1+Z^{-2}}$

FREQUENCY-GAIN CHARACTERISTIC
FOR $H(z) = HB(z)^3$

IMPULSE RESPONSE FOR
$H_L(z) = \dfrac{1 - Z^{-6}}{1 - Z^{-1}}$

FREQUENCY-GAIN CHARACTERISTIC FOR $H_L(z)$

FREQUENCY-GAIN CHARACTERISTIC
FOR $H(z) = H_L(z)^3$ 5,848,100

FREQUENCY CONVERSION AND MODULATION CIRCUITS

BACKGROUND OF THE INVENTION

The present invention relates to frequency conversion and modulation circuits for use in a radio transmitter such as a car telephone or a portable telephone.

FIG. 16 shows an arrangement of a prior art modulator, which includes an input terminal 1 for input of digital base band send signal connected to a digital-to-analog (D/A) converter 2, an analog multiplier 4 connected to a low-pass filter (LPF) 3, a clock generation circuit 5 connected to the D/A converter 2, an oscillator 6 connected to the analog multiplier 4, and an output terminal 7 for output of analog modulated wave connected to the analog multiplier 4.

Explanation will be made below as to the operation of the prior art modulator having such an arrangement as mentioned above. First, when a digital base band send signal (such as a D/A-converted voice or modem signal) is applied to the input terminal 1, the D/A converter 2 receives the digital base band send signal from the input terminal 1, converts it to a sample value signal on the basis of a sampling clock of 384 kHz received from the clock generation circuit 5, and then sends the sample value signal to the LPF 3 where the sample value signal is subjected to interpolating operation to obtain an analog base band send signal. The analog base band send signal is further multiplied at the analog multiplier 4 by a sinusoidal wave of 24 MHz received from the oscillator 6 to be frequency-converted into a modulated wave having a center frequency of 24 MHz. The modulated wave is output from the output terminal 7.

As mentioned above, even the above prior art can operate as a modulation circuit.

With the above prior art modulation circuit, however, the sample value output of the D/A converter is required to act to cause the interpolating LPF to have such an abrupt characteristic curve as to suppress a harmonic spectrum having frequencies corresponding to a multiple of a relatively low sampling frequency of 384 kHz. In this connection, since a DC offset voltage applied to an operational amplifier in the circuit causes deterioration of the modulated wave, e.g., carrier leak; it is disadvantageously difficult for the circuit to realize its miniaturization and adjustment-free configuration.

SUMMARY OF THE INVENTION

The present invention has been made to solve the above problem in the prior art and, it is an object of the present invention to provide frequency conversion & modulation circuits which can realize their small-sized and adjustment-free configurations.

In accordance with the present invention, the above object is attained, in view of the fact that the transfer function of a filter of a delay-distortion-free, rectangular impulse response type can be given in the form of a sum of series without any multiplication, by forming the filter in the form of a sum of series of the transfer function and by extracting a harmonic spectrum while interpolating a digital send signal to execute frequency conversion, whereby the circuit can be made small in size and to have an adjustment-free structure.

When the digital band pass send signal is interpolated to make the sampling frequency high, the characteristic curve of the interpolating filter after the D/A conversion can be made gentle and thus the circuit can be miniaturized. Further, when one of frequencies of a harmonic spectrum corresponding to an integer multiple of the sampling frequency is extracted during the interpolation of the digital band pass send signal, the frequency conversion is carried out to obtain a band pass signal and then the signal is subjected to the D/A conversion. Thus, a D.C. offset voltage later applied to an operational amplifier or the like can be prevented from causing deterioration of the modulated wave, e.g., carrier leak and thus the circuit can have an adjustment-free structure. Furthermore, when the digital filter for performing the above interpolation and frequency conversion is of a delay-distortion-free, rectangular impulse response type which is arranged in the form of a sum of series indicative of the filter transfer function, the filter can be implemented without using any multiplier and with delay circuits and adders/subtractors. In addition, since the numerator of the transfer function operates with a low-speed clock signal, the numbers of delay circuits and adders/subtractors can be remarkably reduced when compared to those in an ordinary filter structure based on "sum of products" calculation, with the result that the circuit can be made smaller in size with smaller power consumption. Since multiplication is unnecessary and a less number of adders/subtractors is required, the filter calculation can be carried out based on integer operation without any operational error only by increasing the word length (number of adders/subtractors) of the adders/subtractors by the number of bits.

DESCRIPTION OF THE PREFERRED EMBODIMENTS

A frequency conversion circuit in accordance with a first embodiment of the present invention will be explained with reference to a block diagram of FIG. 1 and a timing chart of FIG. 2.

In the frequency conversion circuit of the first embodiment, a 12-bit digital band pass send signal having a sampling frequency of 768 kHz, a center frequency of 96 kHz and a band width of 16 kHz is subjected to a frequency conversion to a 24 MHz digital band pass send signal having a sampling frequency of 96 MHz (=768 kHz ×125) and a center frequency of 24 MHz, subjected to a D/A conversion, and then passed through a band pass filter (BPF) of a center frequency 24 MHz to obtain an analog send signal. The digital filter in the first embodiment has a transfer function H(z) which is expressed as:

$$H(z) = HB(z)*HB(z)*HB(z) \quad (1)$$

$$HB(z) = \frac{1 + z^{-250}}{1 + z^{-2}} = 1 - z^{-2} + z^{-4} - \ldots + z^{-248}$$

where $z^{-1}$ indicates a delay of $(96 \text{ MHz})^{-1}$.

Figure 3:
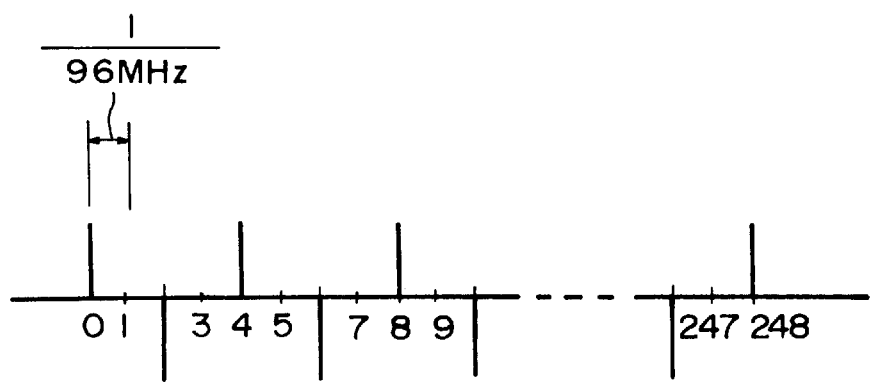
FIG. 3 shows a waveform of impulse response to a transfer function HB(z) in the first embodiment of the present invention.
Figure 4A:
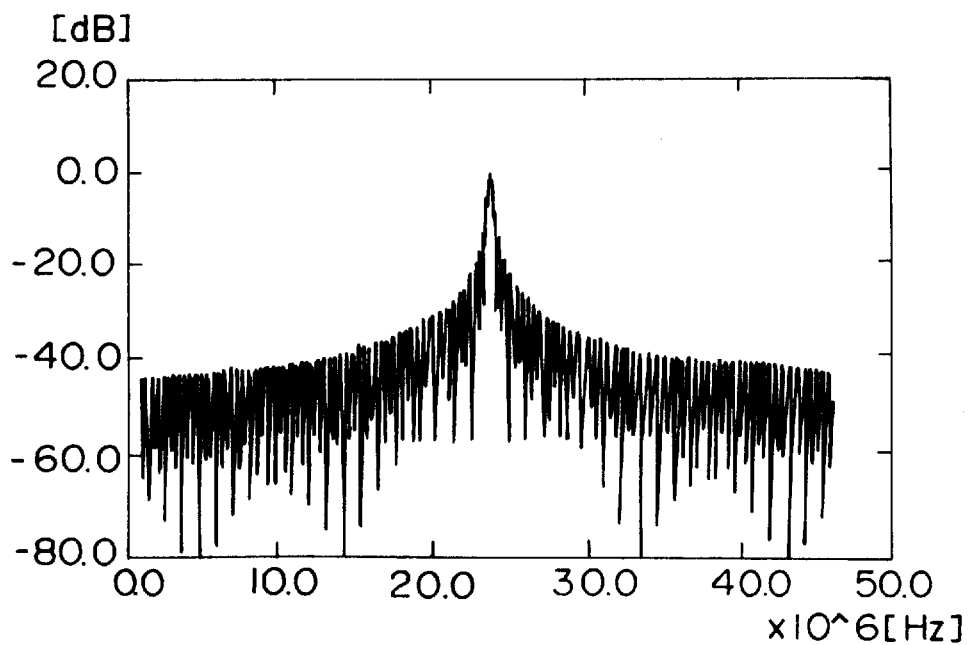
FIGS. 4A and 4B are characteristic diagrams showing relationships between the frequency and gain of a transfer function HB(z) in the first embodiment of the present invention.
Figure 4B:
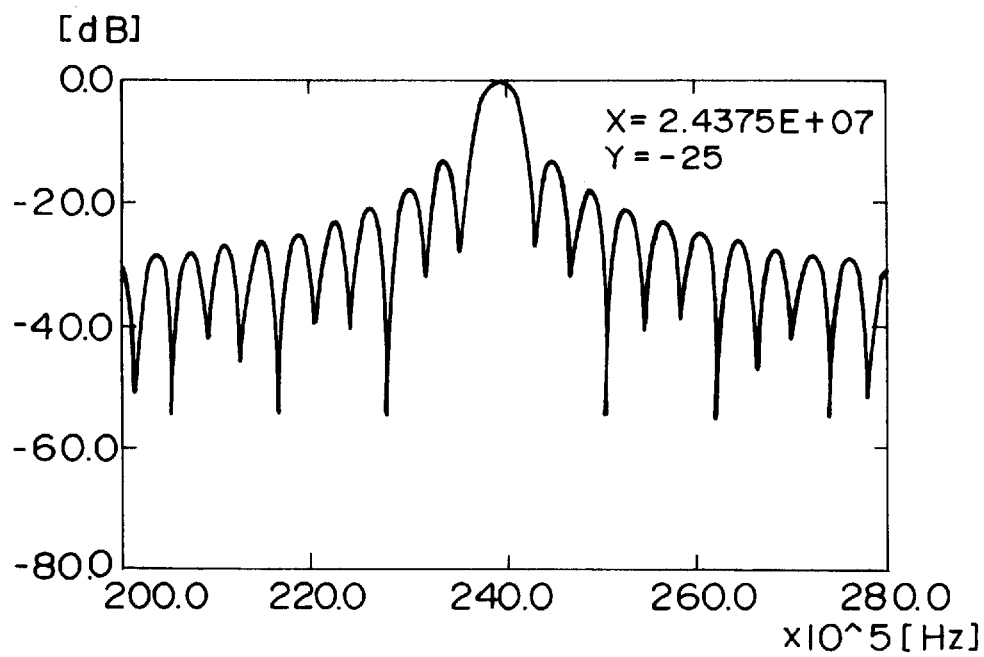
Figure 5A:
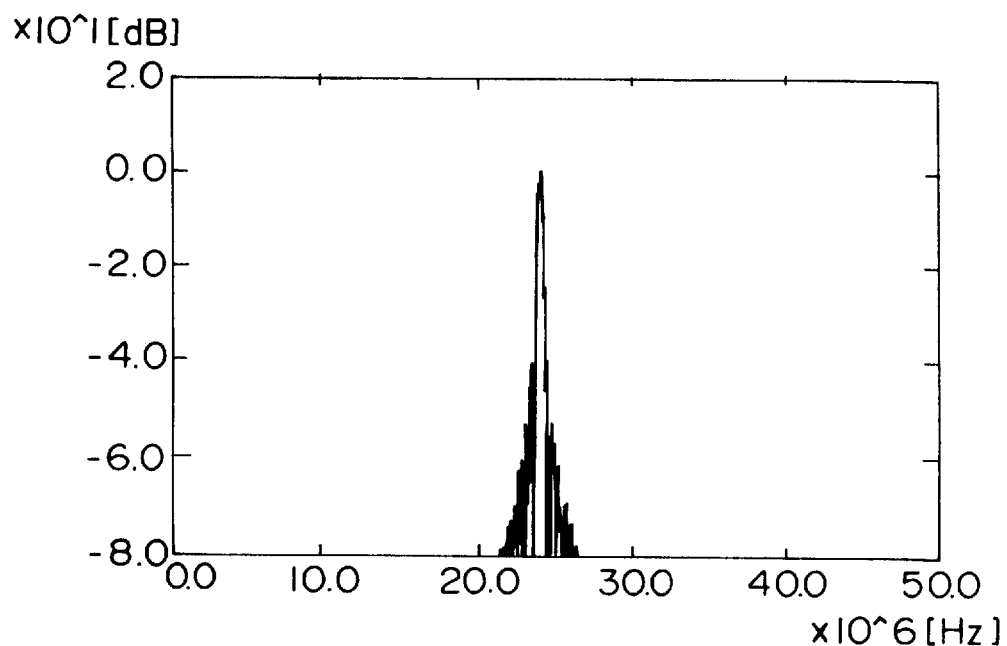
FIGS. 5A and 5B are characteristic diagrams showing relationships between the frequency and gain of a transfer function H(z) in the first embodiment of the present invention.
Figure 5B:
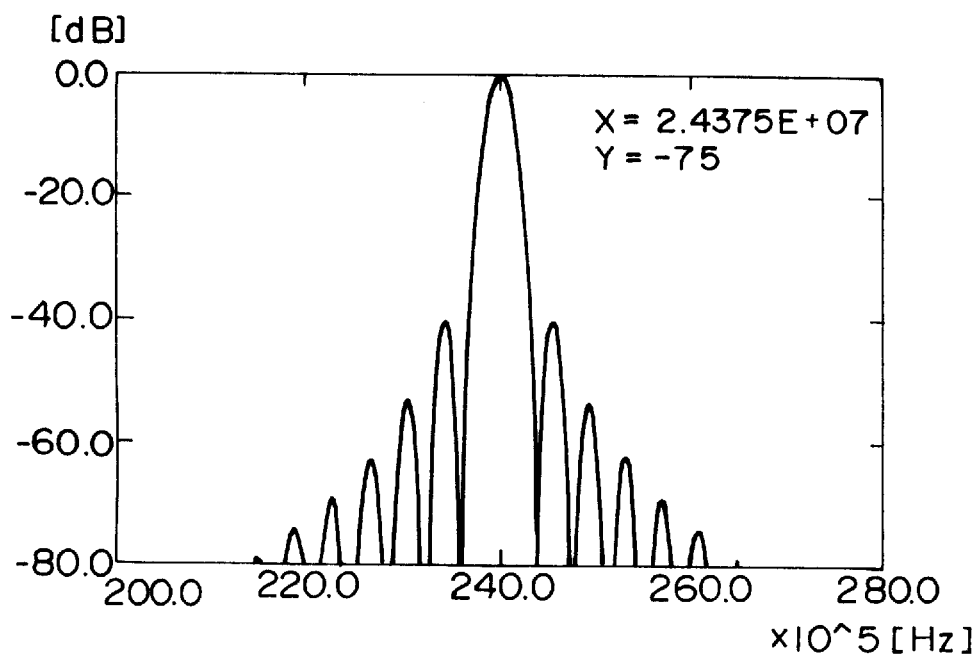
Figure 6A:
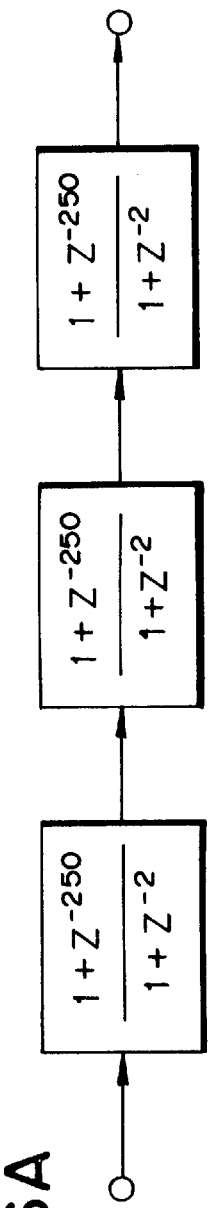
FIGS. 6A, 6B and 6C show filter configurations for implementing the transfer function in the first embodiment of the present invention.
Figure 6B:
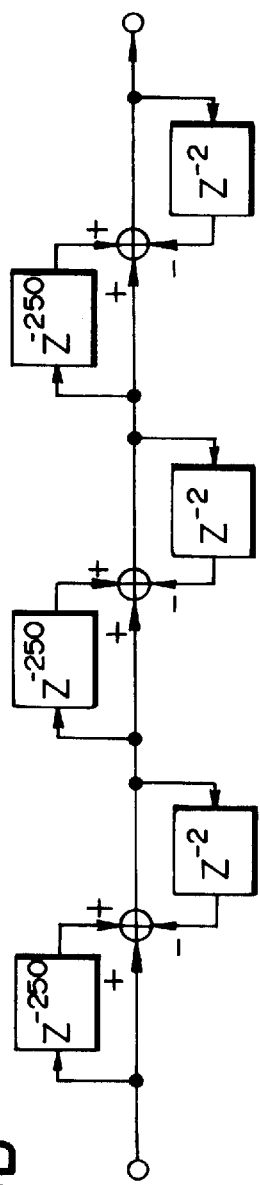
Figure 6C:
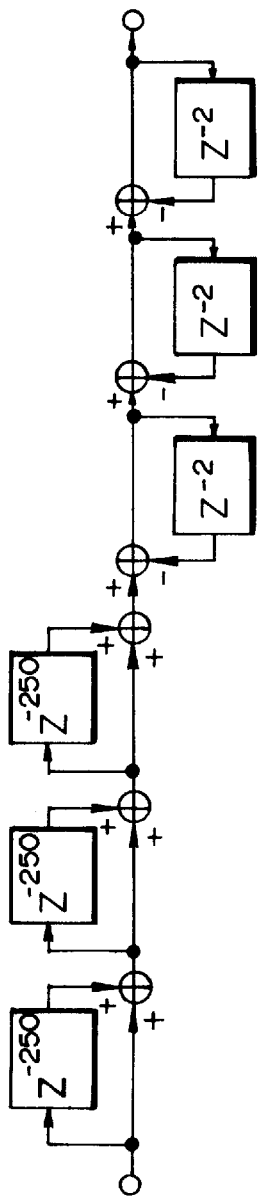

FIG. 3 is a waveform of impulse response to a transfer function HB(z), FIGS. 4A and 4B are frequency-gain characteristic diagrams for the transfer function, and FIGS. 5A and 5B are frequency-gain characteristic diagrams for the transfer function H(z). The present filter is a BPF having a center frequency of 24 MHz. Since points of a harmonic spectrum spaced from the center frequency by a multiple of 384 kHz correspond to notch frequencies of the transfer function H(z), it will be seen that these spectrum points are attenuated by 70 dB or more. FIGS. 6A, 6B and 6C are configurations for implementing the transfer function expressed by the equation (1), wherein FIG. 6A is a mere cascade-connection configuration, FIG. 6B is a direct type configuration of the transfer functions HB(z) of FIG. 6A, and FIG. 6C corresponds to FIG. 6B but numerator parts of the transfer function H(z) operating at the sampling frequency of 768 kHz are rearranged as connected in its preceding stage while denominator parts of the transfer function H(z) operating at the sampling frequency of 96 MHz are rearranged as connected in its latter stage. In the present embodiment, the configuration of FIG. 6C is employed.

Figure 1:
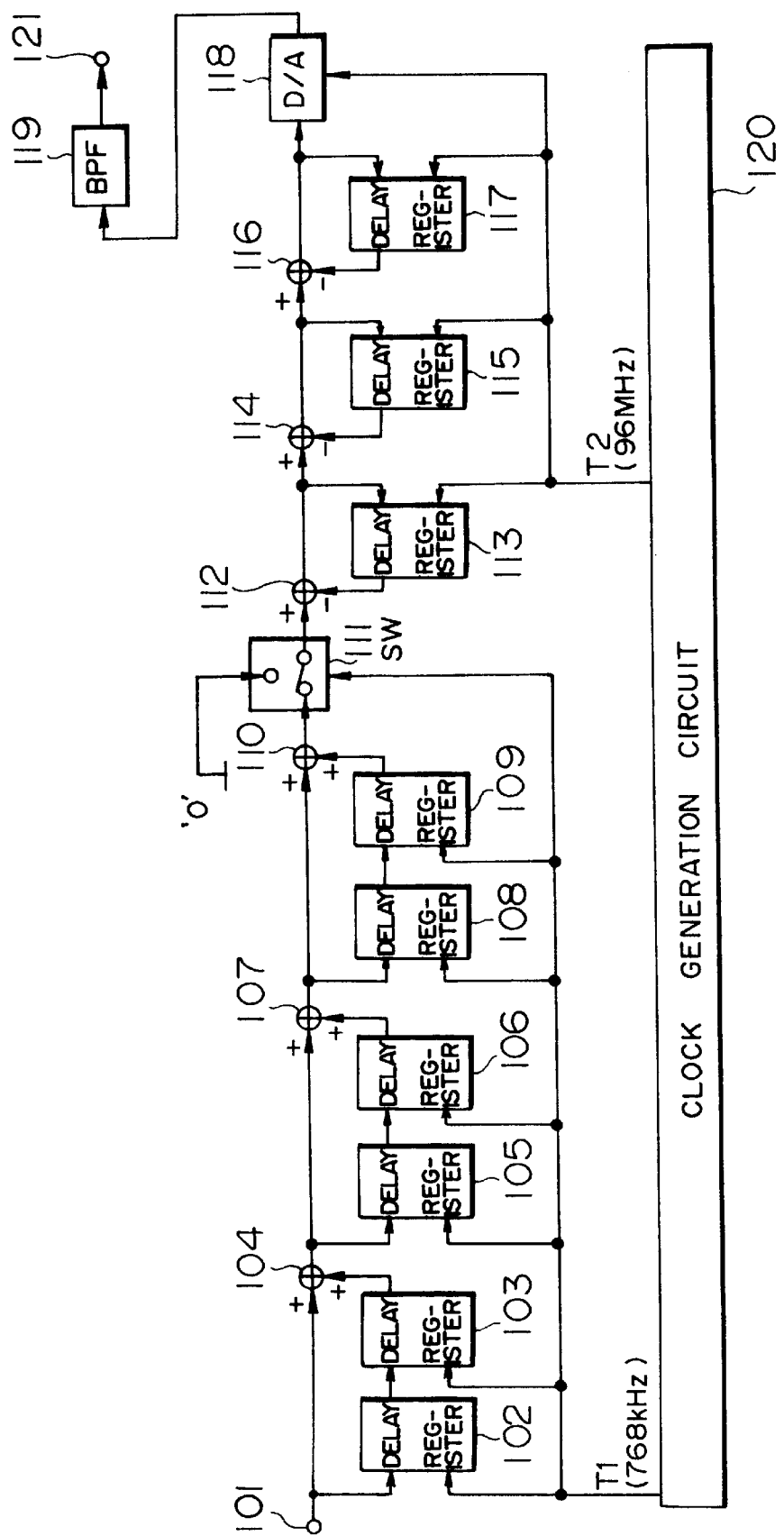
FIG. 1 is a block diagram of an arrangement of a frequency conversion circuit in accordance with a first embodiment of the present invention.
Figure 2:
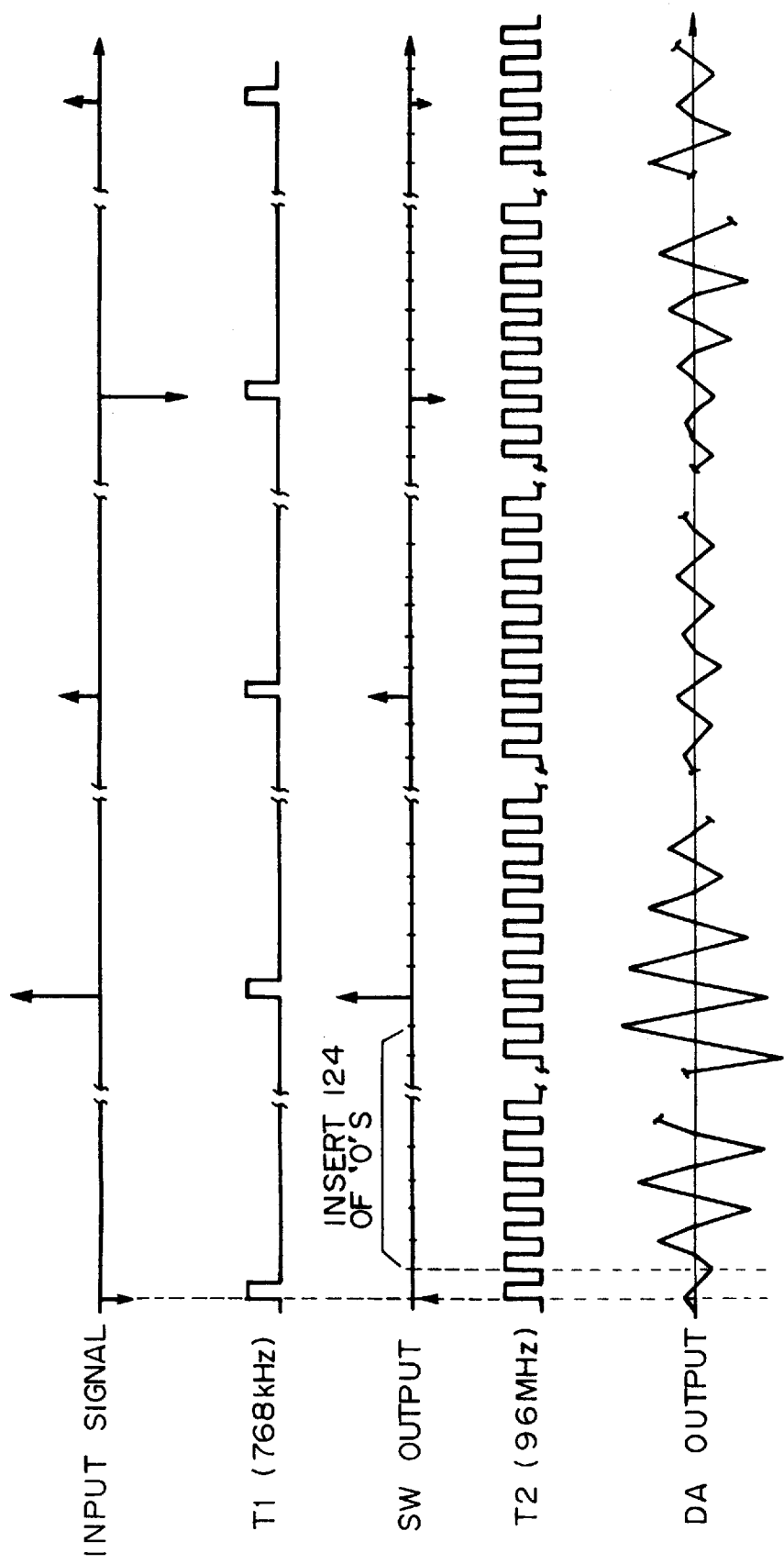
FIG. 2 is a timing chart of signals appearing in the first embodiment of the present invention.

In FIG. 1, an input terminal 101 for input of digital band pass send signal is connected to a delay register 102 and a clock generation circuit 120. A delay register 103 is of a 12-bit type. The delay register 102, which is of a 12-bit type, is connected to the input terminal 101, delay register 103 and clock generation circuit 120. An adder 104 is of a 13-bit type. The delay register 103 is connected to the delay register 102, adder 104 and clock generation circuit 120. A delay register 105 is of a 13-bit type and a adder 107 is of a 14-bit type. The adder 104 is connected to the input terminal 101, delay register 103, delay register 105 and adder 107. A delay register 106 is of a 13-bit type. The delay register 105 is connected to the adder 104, delay register 106 and clock generation circuit 120. The delay register 106 is connected to the delay register 105, adder 107 and clock generation circuit 120. A delay register 108 is of a 14-bit type and an adder 110 is of a 15-bit type. The adder 107 is connected to the adder 104, delay register 105, delay register 106, delay register 108 and adder 110. A delay register 109 is of a 14-bit type. The delay register 108 is connected to the adder 107, delay register 109, adder 110 and clock generation circuit 120. The delay register 109 is connected to the delay register 108, adder 110 and clock generation circuit 120. A switch (SW) 111 is for insertion of 0 signal. The adder 110 is connected to the adder 107, delay register 108, delay register 109 and switch 111. A subtractor 112 is of a 16-bit type. The switch 111 is connected to the adder 110, subtractor 112 and clock generation circuit 120. A delay register 113 is of a 16-bit type and a subtractor 114. The subtractor 112 is connected to the switch 111, delay register 113 and subtractor 114. A delay register 115 is of a 17-bit type. The delay register 113 is connected to the subtractor 112, subtractor 114, delay register 115 and clock generation circuit 120. A subtractor 116 is of a 18-bit type. The subtractor 114 is connected to the delay register 113, delay register 115 and subtractor 116. The delay register 115 is connected to the subtractor 114, subtractor 116 and clock generation circuit 120. A delay register 117 is of a 18-bit type and a D/A converter 118 is of a 12-bit type. The subtractor 116 is connected to the delay register 115, delay register 117 and D/A converter 118. The delay register 117 is connected to the subtractor 116, D/A converter 118, and clock generation circuit 120. A BPF 119 is of an analog type. The D/A converter 118 is connected to the subtractor 116, delay register 117, analog BPF 119 and clock generation circuit 120. Reference numeral 120 denotes a clock generation circuit. The analog BPF 119 is connected to the D/A converter 118 and clock generation circuit 120. The clock generation circuit 120 is connected to the delay register 102, delay register 103, delay register 105, delay register 106, delay register 108, delay register 109, switch 111, delay register 113, delay register 115, delay register 117 and D/A converter 118. Numeral 121 denotes an output terminal for output of analog modulated wave, which terminal is connected to the analog BPF 119. Explanation will then made as to the operation of the present embodiment. In FIG. 1, when the input terminal 101 for input of digital band pass send signal, first of all, receives one sample at a rising edge of a 768 kHz clock signal from the clock generation circuit 120, the adder 104 adds contents of the delay register 103 to the input signal, the adder 107 adds contents of the delay register 109 to an output of the adder 107, the adder 110 adds contents of the delay register 109 to an output of the adder 107 and outputs the addition to the switch 111, such that, at a falling edge of the 768 kHz clock signal, an output of the delay register 108 is applied to the delay register 109, the output of the adder 107 is to the delay register 108, an output of the delay register 105 to the delay register 106, the output of the adder 104 is to the delay register 105, an output of the delay register 102 is to the delay register 103, and an input signal received from the input terminal 101 is sent to the delay register 102. The switch 111 outputs the output of the adder 110 for a time corresponding to one clock of a 96 MHz clock signal from the rising edge point of the 768 MHz clock signal, but outputs zero for a time corresponding to the remaining 124 clocks as 96 MHz sampling output signal. Further, at the rising edge of the 96 MHz clock signal received from the clock generation circuit 120, the subtractor 112 subtracts contents of the delay register 113 from the output of the switch 111, the subtractor 114 subtracts contents of the delay register 115 from an output of the subtractor 112, the subtractor 116 subtracts contents of the delay register 117 from an output of the subtractor 114 and outputs its subtraction result to the D/A converter 118. At the falling edge of the 96 MHz clock signal, the output of the subtractor 116 is applied to the delay register 117, the output of the subtractor 114 is to the delay register 115, the output of the subtractor 112 is to the delay register 113. An output of the D/A converter 118 is passed through the analog BPF 119 having a center frequency of 24 MHz to form an analog send signal.

In this way, in accordance with the first embodiment of the present invention, by performing interpolating operation over the digital band pass send signal to make the sampling frequency high, the characteristic curve of the analog BPF 119 can be made gentle to realize a small-sized circuit. Further, during the interpolation of the digital band pass send signal, one of frequencies of a harmonic spectrum corresponding to a multiple of the sampling frequency is extracted for frequency conversion to obtain a band pass signal and then the signal is subjected to the D/A conversion. For this reason, a DC offset voltage applied later to an operational amplifier or the like will cause any deterioration of the modulated wave, e.g., carrier leak, thus realizing an adjustment-free circuit.

When the digital filter (comb filter) for performing the aforementioned interpolation and frequency-conversion is of a group-delay-distortion-free, rectangular impulse response type and is implemented in the form of a sum of series indicative of its filter transfer function, this filter can eliminate the need for provision of any multipliers and can be realized with use of delay circuits and adders/subtractors alone. That is, frequency conversion can be carried out without any need of adjustment with use of the delay-distortion-free digital filter. Further, since this digital filter, in spite of the sampling frequency of 96 MHz, operates at 768 kHz for half of the processing thereof, the filter only requires 3 delay circuits and 2 subtractors per stage HB(z), that is, a total of 9 delay circuits and 6 subtractors, with the result that the entire circuit can be made small in size and low in power consumption. In addition, when the subtractor having a word length of a maximum of 18 bits is prepared, the calculation can be executed without error.

(Second Embodiment)

Explanation will next be made as to a frequency conversion circuit in accordance with a second embodiment of the present invention, by referring to a block diagram of FIG. 7 and a timing chart of FIG. 8.

In the frequency conversion circuit of the present embodiment, a 12-bit digital band pass send signal having a sampling frequency of 768 kHz, a center frequency of 96 kHz and a band width of 16 kHz is subjected to a frequency conversion to a digital band pass send signal having a sampling frequency of 96 MHz (=768 kHz×250) and a center frequency of 24 MHz, and then passed through a BPF having a center frequency of 24 MHz to obtain an analog send signal. The transfer function H(z) of a digital filter in the present embodiment is also expressed by the above equation (1) and the part of the filter operating at the sampling frequency of 768 kHz is the same as in the first embodiment, but the input signal is converted through a 768 kHz D/A converter to a sample value signal and then subjected by a switched capacitor circuit (which will be referred to as the SC circuit, hereinafter) having a 96 MHz operation to filtering processing, whereby the conversion speed of the D/A converter is suppressed to realize a low power consumption.

Figure 7:
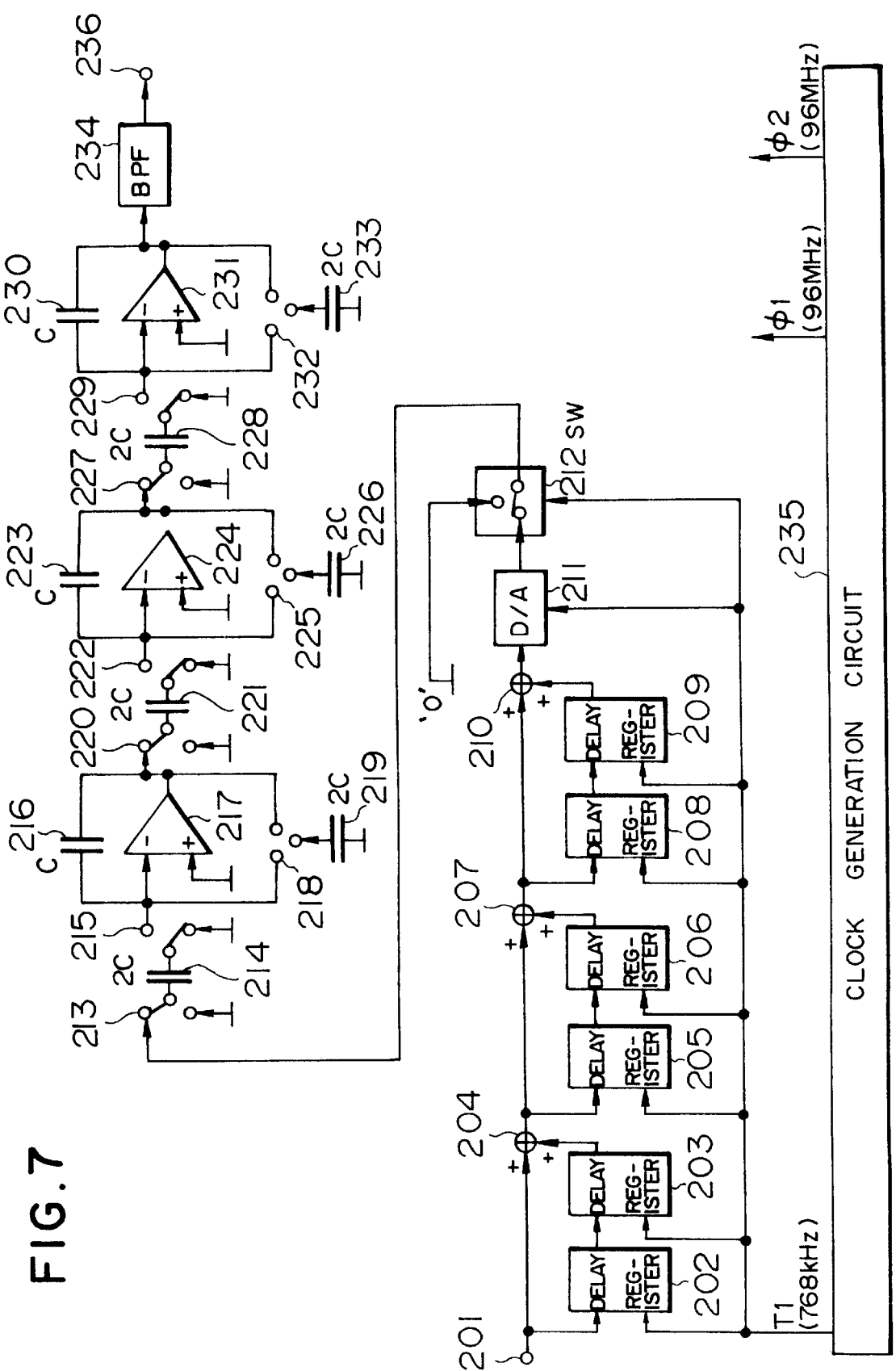
FIG. 7 is a block diagram of an arrangement of a frequency conversion circuit in accordance with a second embodiment of the present invention.
Figure 8:
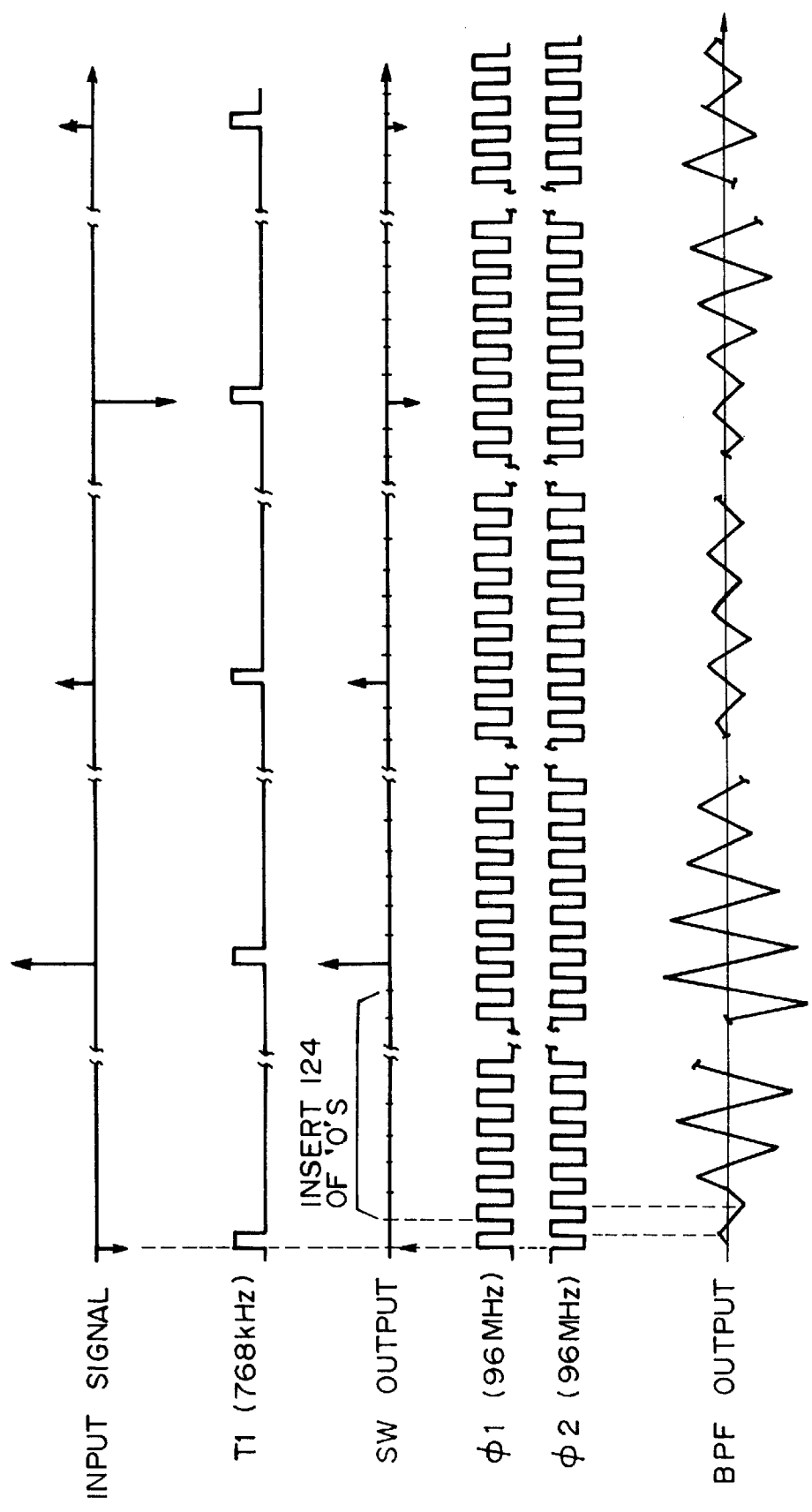
FIG. 8 is a timing chart of signals appearing in the second embodiment of the present invention.

In FIG. 7, an input terminal 201 is for input of digital band pass send signal, a delay register 202 is of a 12-bit type, and a clock generation circuit 235. The input terminal 201 is connected to the delay register 202 and clock generation circuit 235. A delay register 203 is of a 12-bit type. The delay register 202 is connected to the input terminal 201, delay register 203 and clock generation circuit 235. A delay register 205 and an adder 207 are of a 14-bit type. An adder 204, which is a 13-bit type, is connected to the input terminal 201, delay register 203, delay register 205 and adder 207. A delay register 206 is of a 13-bit type. The delay register 205 is connected to the adder 204, delay register 206 and clock generation circuit 235. The delay register 206 is connected to the delay register 205, adder 207 and clock generation circuit 235. A delay register 208 is of a 14-bit type and an adder 210 is of a 15-bit type. The adder 207 is connected to the adder 204, delay register 205, delay register 206, delay register 208 and adder 210. A delay register 209 is of a 14-bit type. The delay register 208 is connected to the adder 207, delay register 209, adder 210 and clock generation circuit 235. The delay register 209 is connected to the delay register 208, adder 210 and clock generation circuit 235. A D/A converter 211 is of a 12-bit type. The adder 210 is connected to the adder 207, delay register 208, delay register 209 and D/A converter 211. A switch (SW) 212 is for insertion of 0 signal. The D/A converter 211 is connected to the adder 210, switch 212 and clock generation circuit 235. Reference numeral 213 denotes an analog switch. The switch 212 is connected to the D/A converter 211, analog switch 213 and clock generation circuit 235. A capacitor 214 has a capacitance of 2C. The analog switch 213 is connected to the switch 212 and capacitor 214. Numeral 215 denotes an analog switch. The capacitor 214 is connected to the analog switch 213 and analog switch 215. Numeral 218 denotes an analog switch and 216 denotes a capacitor having a capacitance of 2C. The analog switch 215 is connected to the capacitor 214, analog switch 218 and capacitor 216. Numeral 217 denotes an operational amplifier and 220 denotes an analog switch. The capacitor 216 is connected to the analog switch 215, operational amplifier 217, analog switch 218 and analog switch 220. The operational amplifier 217 is connected to the analog switch 215, capacitor 216, analog switch 218 and analog switch 220. Numeral 219 denotes a capacitor having a capacitance of 2C. The analog switch 218 is connected to the analog switch 215, capacitor 216, operational amplifier 217, capacitor 219 and analog switch 220. The capacitor 219 is connected to the analog switch 218. Numeral 221 denotes a capacitor having a capacitance of 2C. The analog switch 220 is connected to the capacitor 216, operational amplifier 217, analog switch 218 and capacitor 221. Numeral 222 denotes an analog switch. The capacitor 221 is connected to the analog switch 220 and analog switch 222. Numeral 223 denotes a capacitor having a capacitance of C, 224 denotes an operational amplifier, and 225 denotes an analog switch. The analog switch 222 is connected to the capacitor 221, capacitor 223, operational amplifier 224 and analog switch 225. Numeral 227 denotes an analog switch. The capacitor 223 is connected to the analog switch 222, operational amplifier 224, analog switch 225 and analog switch 227. The operational amplifier 224 is connected to the analog switch 222, capacitor 223, analog switch 225 and analog switch 227. Numeral 226 denotes a capacitor having a capacitance of C. The analog switch 225 is connected to the analog switch 222, capacitor 223, operational amplifier 224, capacitor 226 and analog switch 227. The capacitor 226 is connected to the analog switch 225. Numeral 228 denotes a capacitor having a capacitance of 2C. The analog switch 227 is connected to the capacitor 223, operational amplifier 224, capacitor 226 and capacitor 228. Numeral 229 denotes a analog switch. The capacitor 228 is connected to the analog switch 227 and analog switch 229. Numeral 230 denotes a capacitor having a capacitance of C, 231 denotes an operational amplifier, and 232 denotes an analog switch. The analog switch 229 is connected to the capacitor 228, capacitor 230, operational amplifier 231 and analog switch 232. Numeral 234 denotes an analog BPF. The capacitor 230 is connected to the analog switch 229, operational amplifier 231, analog switch 232 and analog BPF 234. The operational amplifier 231 is connected to the analog switch 229, capacitor 230, operational amplifier 231 and analog BPF 234. Numeral 233 denotes a capacitor having a capacitance of 2C. The analog switch 232 is connected to the analog switch 229, capacitor 230, input terminal 201, capacitor 233 and analog BPF 234. The capacitor 233 is connected to the analog switch 232. Numeral 236 denotes an analog modulated wave output terminal. The analog BPF 234 is connected to the capacitor 230, operational amplifier 231, capacitor 233 and analog modulated wave output terminal 236. The clock generation circuit 235 is connected to the delay register 202, delay register 203, delay register 205, delay register 206, delay register 208, delay register 209, D/A converter 211 and switch 212. The analog modulated wave output terminal 236 is connected to the analog BPF 234.

In the operation of the present embodiment of FIG. 7, when the adder 204 receives one sample from the input terminal 201 at a rising edge of a 768 kHz clock signal received from the clock generation circuit 235, the adder 204 adds contents of the delay register 203 to the input signal, the adder 207 adds contents of the delay register 206 to an output of the adder 204, the adder 210 adds contents of the delay register 209 to an output of the adder 207 and outputs its addition result to the D/A converter 211 to obtain a sample value signal therein, and then the D/A converter 211 outputs the sample value signal to the switch 212, such that, at a falling edge of the 768 MHz clock signal, an output of the delay register 208 is applied to the delay register 209, an output of the adder 207 is to the delay register 208, an output of the delay register 205 is to the delay register 206, an output of the adder 204 is to the delay register 205, an output of the delay register 202 is to the delay register 203, and the input signal of the input terminal 201 is applied to the delay register 202. In this connection, the switch 212 outputs the output of the D/A converter 211 for a time corresponding to one clock of the 96 MHz clock signal from the rising edge of the 768 kHz clock signal but outputs 0 for a time corresponding to the remaining 124 clocks thereof for 96 MHz sampling output. Further, at rising edges of a 96 MHz clock signal φ1 from the clock generation circuit 235, the capacitor 214 is charged up to the output voltage of the switch 212, the capacitors 219 and 221 are charged up to the output voltage of the operational amplifier 217, the capacitors 226 and 228 are charged up to the output voltage of the operational amplifier 224, the capacitor 233 is charged up to the output voltage of the operational amplifier 231, and the output voltege of the operational amplifier 224 is held at falling edges of the φ1 . Next, at rising edges of a 96 MHz clock signal φ2 from the clock generation circuit 235, charges accumulated in the capacitors 214 and 219 are shifted to the capacitor 216, charges in the capacitors 221 and 226 are shifted to the capacitor 223, charges in the capacitors 228 and 233 are shifted to the capacitor 230, which states are held at falling edges of the clock signal φ2, thus obtaining an analog send signal at the analog BPF 234 having the center frequency of 24 MHz.

As mentioned above, in accordance with the second embodiment of the present invention, frequency conversion can be carried out with a small-sized, adjustment-free circuit as in the first embodiment. Further, when it is desired to perform interpolation of the digital band pass send signal and extraction of harmonics according to the above equation (1), the numerator part thereof is implemented by a digital circuit and subjected to D/A conversion at 768 kHz, and the denominator part thereof is implemented by an SC circuit providing non-adjustment, whereby the D/A conversion speed can be suppressed and the low power consumption can be realized.

(Third Embodiment)

Figure 9:
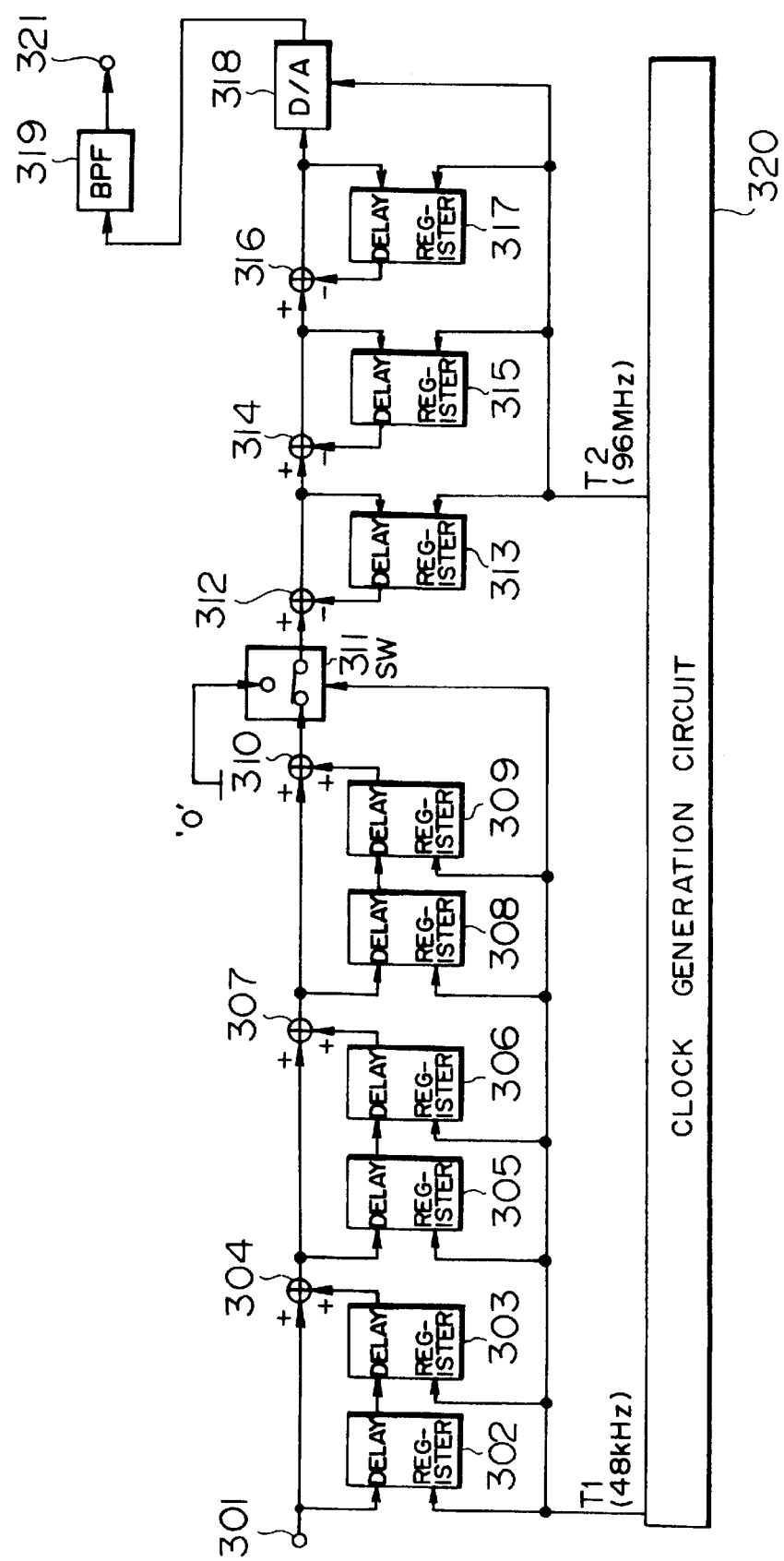
FIG. 9 is a block diagram of an arrangement of a part of a modulation circuit in accordance with a third embodiment of the present invention.

Explanation will then be made as to a third embodiment of the present invention. Shown in FIG. 9 is a block diagram of an arrangement of a frequency conversion circuit in a modulation circuit of the present embodiment.

In the modulation circuit of the present embodiment, a 12-bit digital band pass send signal having a sampling frequency of 48 kHz and a band width of 16 kHz is subjected to a frequency conversion to a digital band pass send signal having a sampling frequency of 96 MHz (=384 kHz×250) and a center frequency of 24 MHz, subjected to a D/A conversion, and then passed through a BPF having a center frequency of 24 MHz to obtain an analog send signal. The transfer function H(z) of a digital filter in the present embodiment is expressed by an equation (2) which follows.

$$H(z) = HB(z)*HB(z)*HB(z) \qquad (2)$$

$$HB(z) = \frac{1 + z^{-250}}{1 + z^{-2}} = 1 - z^{-2} + z^{-4} - \ldots + z^{-248}$$

where $z^{-1}$ denotes a delay of $(384\ kHz)^{-1}$.

In FIG. 9, reference numeral 301 denotes an input terminal for input of digital band pass send signal, numeral 302 denotes a 12-bit delay register 302, and 320 denotes a clock generation circuit. The input terminal 301 is connected to the delay register 302 and clock generation circuit 320. Numeral 303 denotes a 12-bit delay register. The delay register 302 is connected to the input terminal 301, delay register 303 and clock generation circuit 320. Numeral 304 denotes a 13-bit adder. The delay register 303 is connected to the delay register 302, adder 304 and clock generation circuit 320. Numeral 305 denotes a 13-bit delay register, and 307 denotes a 14-bit adder. The adder 304 is connected to the input terminal 301, delay register 303, delay register 305 and adder 307. Numeral 306 denotes a 13-bit delay register. The delay register 305 is connected to the adder 304, delay register 306 and clock generation circuit 320. The delay register 306 is connected to the delay register 305, adder 307 and clock generation circuit 320. Numeral 308 denotes a 14-bit delay register and 310 denotes a 15-bit adder. The adder 307 is connected to the adder 304, delay register 305, delay register 306, delay register 308 and adder 310. Numeral 309 denotes a 14-bit delay register. The delay register 308 is connected to the adder 307, delay register 309, adder 310 and clock generation circuit 320. The delay register 309 is connected to the delay register 308, adder 310 and clock generation circuit 320. Numeral 311 denotes a switch (SW) for insertion of 0 signal. The adder 310 is connected to the adder 307, delay register 308, delay register 309 and switch 311. Numeral 312 denotes a 16-bit subtractor. The switch 311 is connected to the adder 310, subtractor 312 and clock generation circuit 320. Numeral 313 denotes a 16-bit delay register and 314 denotes a 17-bit subtractor. The subtractor 312 is connected to the switch 311, delay register 313 and subtractor 314. Numeral 315 denotes a 17-bit delay register. The delay register 313 is connected to the subtractor 312, subtractor 314, delay register 315 and clock generation circuit 320. Numeral 316 denotes a 18-bit subtractor. The subtractor 314 is connected to the delay register 313, delay register 315 and subtractor 316. The delay register 315 is connected to the subtractor 314, subtractor 316 and clock generation circuit 320. Numeral 317 denotes a 18-bit delay register and 318 denotes a 12-bit D/A converter. The subtractor 316 is connected to the delay register 315, delay register 317 and D/A converter 318. The delay register 317 is connected to the subtractor 316, D/A converter 318 and clock generation circuit 320. Numeral 319 denotes an analog BPF. The D/A converter 318 is connected to the subtractor 316, delay register 317, analog BPF 319 and clock generation circuit 320. Numeral 321 denotes an analog modulated wave output terminal. The analog BPF 319 is connected to the D/A converter 318 and analog modulated wave output terminal 321. The clock generation circuit 320 is connected to the delay register 302, delay register 303, delay register 305, delay register 306, delay register 308, delay register 309, switch 311, delay register 313, delay register 315, delay register 317 and D/A converter 318. The analog modulated wave output terminal 321 is connected to the analog BPF 319.

The operation of the present embodiment will next be explained. In FIG. 9, when the adder 304 receives one sample from the input terminal 301 at a rising edge of a 48 kHz clock signal received from the clock generation circuit 320, the adder 304 adds contents of the delay register 303 to the input signal, the adder 307 adds contents of the delay register 306 to an output of the adder 304, the adder 310 adds contents of the delay register 309 to an output of the adder 307 and outputs its addition result to the switch 311, such that, at a falling edge of the 48 kHz clock signal, an output of the delay register 308 is applied to the delay register 309, an output of the adder 307 is to the delay register 308, an output of the delay register 305 is to the delay register 306, an output of the adder 304 is to the delay register 305, an output of the delay register 302 is to the delay register 303, and the input signal of the input terminal 301 is applied to the delay register 302. In this connection, the switch 311 outputs the output of the adder 310 for a time corresponding to one clock of the 96 MHz clock signal from the rising edge of the 48 kHz clock signal but outputs 0 for a time corresponding to the remaining 124 clocks as 96MHz sampling output signal. Further, at rising edges of a 96 MHz clock signal from the clock generation circuit 320, the subtractor 312 subtracts contents of the delay register 313 from the output of the switch 311, the subtractor 314 subtracts contents of the delay register 315 from the output of the subtractor 312, the subtractor 316 subtracts contents of the delay register 317 from the output of the subtractor 314 and outputs its subtraction result to the D/A converter 318, such that, at falling edges of the 96 MHz clock signal, the output of the subtractor 316 is applied to the delay register 317, the output of the subtractor 314 is to the delay register 315, and the output of the subtractor 312 is to the delay register 313. The output of the D/A converter 318 is passed through the analog BPF 319 having a center frequency of 24 MHz to form an analog send signal.

As mentioned above, in accordance with the third embodiment of the present invention, the digital band pass send signal is interpolated through the digital filter in the preceding stage to obtain a band pass signal having a sampling frequency of 96 MHz and a center frequency of 24 MHz, and the frequency conversion circuit in the first embodiment is employed in the latter stage, with the result that the modulation circuit can be made small in size and to have an adjustment-free structure.

(Fourth Embodiment)

A fourth embodiment of the present invention will be explained. Shown in FIG. 10 is a block diagram of an arrangement of a frequency conversion circuit in a modulation circuit according to the present embodiment.

In the modulation circuit of the present embodiment, a 12-bit digital band pass send signal having a sampling frequency of 48 kHz and a band width of 16 kHz is subjected to a frequency conversion to a digital band pass send signal having a sampling frequency of 96 MHz (=384 kHz×250) and a center frequency of 24 MHz, and then passed through a BPF having a center frequency of 24 MHz to obtain an analog send signal. In the present embodiment, the transfer function H(z) of a digital filter is also expressed by the above equation (2) and the part of the filter operating at the sampling frequency of 48 kHz is the same as in the first embodiment, but the input signal is converted through a 48 kHz D/A converter to a sample value signal and then subjected through a switched capacitor circuit (which will be referred to as the SC circuit, hereinafter) for 96 MHz operation, whereby the conversion speed of the D/A converter is suppressed to realize a low power consumption.

Figure 10:
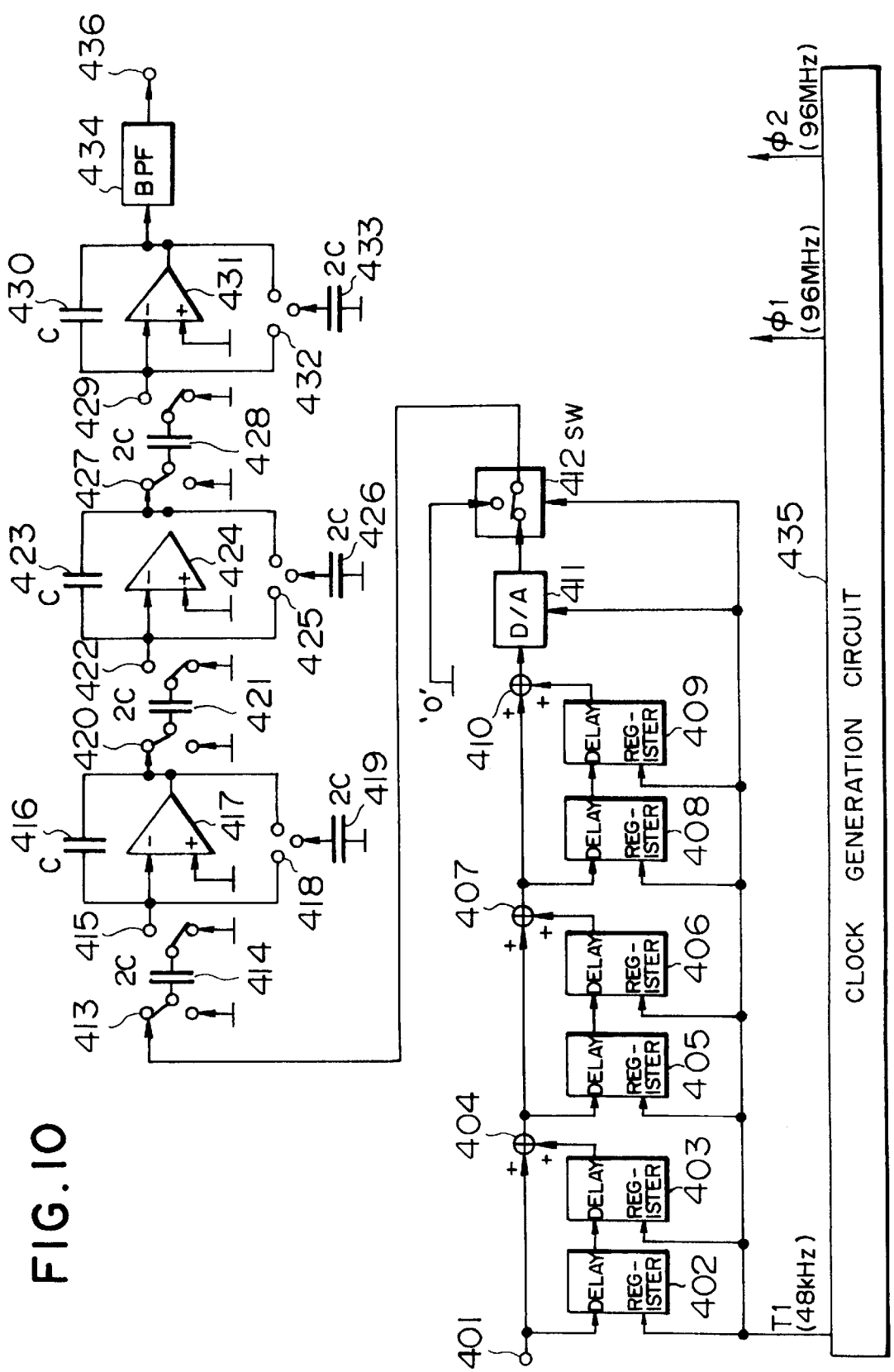
FIG. 10 is a block diagram of an arrangement of a part of a modulation circuit in accordance with a fourth embodiment of the present invention.

In FIG. 10, reference numeral 401 denotes an input terminal for input of digital band pass send signal, numeral 402 denotes a 12-bit delay register, and numeral 435 denotes a clock generation circuit. The input terminal 401 for input of digital band pass send signal is connected to the delay register 402 and clock generation circuit 435. Reference numeral 403 denotes a 12-bit delay register. The delay register 402, which is of a 12-bit type, is connected to the input terminal 401, delay register 403 and clock generation circuit 435. Numeral 404 denotes a 13-bit adder. The delay register 403 is connected to the delay register 402, adder 404 and clock generation circuit 435. Numeral 405 denotes a 13-bit delay register and 407 denotes a 14-bit adder. The adder 404 is connected to the input terminal 401, delay register 403, delay register 405 and adder 407. Numeral 406 denotes a 13-bit delay register. The delay register 405 is connected to the adder 404, delay register 406 and clock generation circuit 435. The delay register 406 is connected to the delay register 405, adder 407 and clock generation circuit 435. Numeral 408 denotes a 14-bit delay register and 410 denotes a 15-bit adder. The adder 407 is connected to the adder 404, delay register 405, delay register 406, delay register 408 and adder 410. Numeral 409 denotes a 14-bit delay register. The delay register 408 is connected to the adder 407, delay register 409, adder 410 and clock generation circuit 435. The delay register 409 is connected to the delay register 408, adder 410 and clock generation circuit 435. Numeral 411 denotes a 12-bit D/A converter. The adder 410 is connected to the adder 407, delay register 408, delay register 409 and D/A converter 411. Numeral 412 denotes a switch (SW) for insertion of 0 signal. The D/A converter 411 is connected to the adder 410, switch 412 and clock generation circuit 435. Numeral 413 denotes an analog switch. The switch 412 is connected to the D/A converter 411, analog switch 413 and clock generation circuit 435. Numeral 414 denotes a capacitor having a capacitance of 2C. The analog switch 413 is connected to the switch 412 and capacitor 414. Numeral 415 denotes an analog switch. The capacitor 414 is connected to the analog switch 413 and analog switch 415. Numeral 418 denotes an analog switch and 416 denotes a capacitor having a capacitance of C. The analog switch 415 is connected to the capacitor 414, analog switch 418 and capacitor 416. Numeral 417 denotes an operational amplifier and 420 denotes an analog switch. The capacitor 416 is connected to the analog switch 415, operational amplifier 417, analog switch 418 and analog switch 420. The operational amplifier 417 is connected to the analog switch 415, capacitor 416, analog switch 418 and analog switch 420. Numeral 419 denotes a capacitor having a capacitance of 2C. The analog switch 418 is connected to the analog switch 415, capacitor 416, operational amplifier 417, capacitor 419 and analog switch 420. The capacitor 419 is connected to the analog switch 418. Numeral 421 denotes a capacitor having a capacitance of 2C. The analog switch 420 is connected to the capacitor 416, operational amplifier 417, analog switch 418 and capacitor 421. Numeral 422 denotes an analog switch. The capacitor 421 is connected to the analog switch 420 and analog switch 422. Numeral 423 denotes a capacitor having a capacitance of C, 424 denotes an operational amplifier, and 425 denotes an analog switch. The analog switch 422 is connected to the capacitor 421, capacitor 423, operational amplifier 424 and analog switch 425. Numeral 427 denotes an analog switch. The capacitor 423 is connected to the analog switch 422, operational amplifier 424, analog switch 425 and analog switch 427. The operational amplifier 424 is connected to the analog switch 422, capacitor 423, analog switch 425 and analog switch 427. Numeral 426 denotes a capacitor having a capacitance of 2C. The analog switch 425 is connected to the analog switch 422, capacitor 423, operational amplifier 424, capacitor 426 and analog switch 427. The capacitor 426 is connected to the analog switch 425. Numeral 428 denotes a capacitor having a capacitance of 2C. The analog switch 427 is connected to the capacitor 423, operational amplifier 424, capacitor 426 and capacitor 428. Numeral 429 denotes an analog switch. The capacitor 428 is connected to the analog switch 427 and analog switch 429. Numeral 430 denotes a capacitor having a capacitance of C, 431 denotes an operational amplifier, and 432 denotes an analog switch. The analog switch 429 is connected to the capacitor 428, capacitor 430, operational amplifier 431 and analog switch 432. Numeral 434 denotes an analog BPF. The capacitor 430 is connected to the analog switch 429, operational amplifier 431, analog switch 432 and analog BPF 434. The operational amplifier 431 is connected to the analog switch 429, capacitor 430, operational amplifier 431 and analog BPF 434. Numeral 433 denotes a capacitor having a capacitance of 2C. The analog switch 432 is connected to the analog switch 429, capacitor 430, input terminal 401, capacitor 433 and analog BPF 434. The capacitor 433 is connected to the analog switch 432. Numeral 436 denotes an analog modulated wave output terminal. The analog BPF 434 is connected to the capacitor 430, operational amplifier 431, capacitor 433 and analog modulated wave output terminal 436. The clock generation circuit 435 is connected to the delay register 402, delay register 403, delay register 405, delay register 406, delay register 408, delay register 409, D/A converter 411 and switch 412. The analog modulated wave output terminal 436 is connected to the analog BPF 434.

In the operation of the present embodiment of FIG. 10, when the adder 204 receives one sample from the input terminal 401 at a rising edge of a 48 kHz clock signal received from the clock generation circuit 435, the adder 404 adds contents of the delay register 403 to the input signal, the adder 407 adds contents of the delay register 406 to an output of the adder 404, the adder 410 adds contents of the delay register 409 to an output of the adder 407 and outputs its addition result to the D/A converter 411 to obtain a sample value signal therein, and then the D/A converter 411 outputs the sample value signal to the switch 412, such that, at a falling edge of the 48 kHz clock signal, an output of the delay register 408 is applied to the delay register 409, an output of the adder 407 is to the delay register 408, an output of the delay register 405 is to the delay register 406, an output of the adder 404 is to the delay register 405, an output of the delay register 402 is to the delay register 403, and the input signal of the input terminal 401 is applied to the delay register 402. In this connection, the switch 412 outputs the output of the D/A converter 411 for a time corresponding to one clock of the 96 MHz clock signal from the rising edge of the 48 kHz clock signal but outputs 0 for a time corresponding to the remaining 124 clocks as 96 MHz sampling output signal. Further, at rising edges of a 96 MHz clock signal $\phi 1$ from the clock generation circuit 435, the capacitor 414 is charged up to the output voltage of the switch 412, the capacitors 419 and 421 are charged up to the output voltage of the operational amplifier 417, the capacitors 426 and 428 are charged up to the output voltage of the operational amplifier 424, the capacitor 433 is charged up to the output voltage of the operational amplifier 431, which states are held at falling edges of the $\phi 1$. Next, at rising edges of a 96 MHz clock signal $\phi 2$ from the clock generation circuit 435, charges accumulated in the capacitors 414 and 419 are shifted to the capacitor 416, charges in the capacitors 421 and 426 are shifted to the capacitor 423, charges in the capacitors 428 and 433 are shifted to the capacitor 430, which states are held at falling edges of the clock signal $\phi 2$, thus obtaining an analog send signal at the analog BPF 434 having the center frequency of 24 MHz.

As mentioned above, in accordance with the fourth embodiment of the present invention, the digital band pass send signal is interpolated through the digital filter in the preceding stage to obtain a band pass signal having a sampling frequency of 384 kHz and a center frequency of 24 MHz, and the frequency conversion circuit in the second embodiment is employed in the latter stage, with the result that the modulation circuit can be made small in size and to have an adjustment-free structure. Further, when the frequency conversion circuit of the second embodiment is employed, the D/A conversion speed can be suppressed and the power consumption can be made low.

(Fifth Embodiment)

Figure 12:
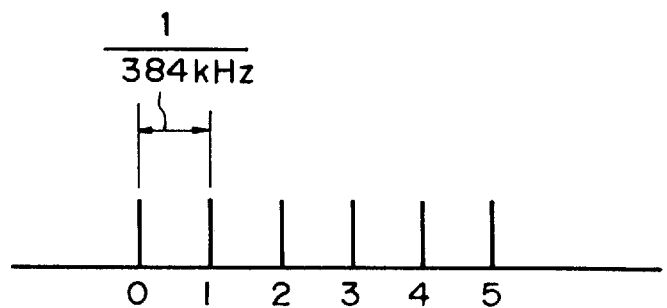
FIG. 12 is a waveform of impulse response to a transfer function HL(z) in the fifth embodiment of the present invention.
Figure 13:
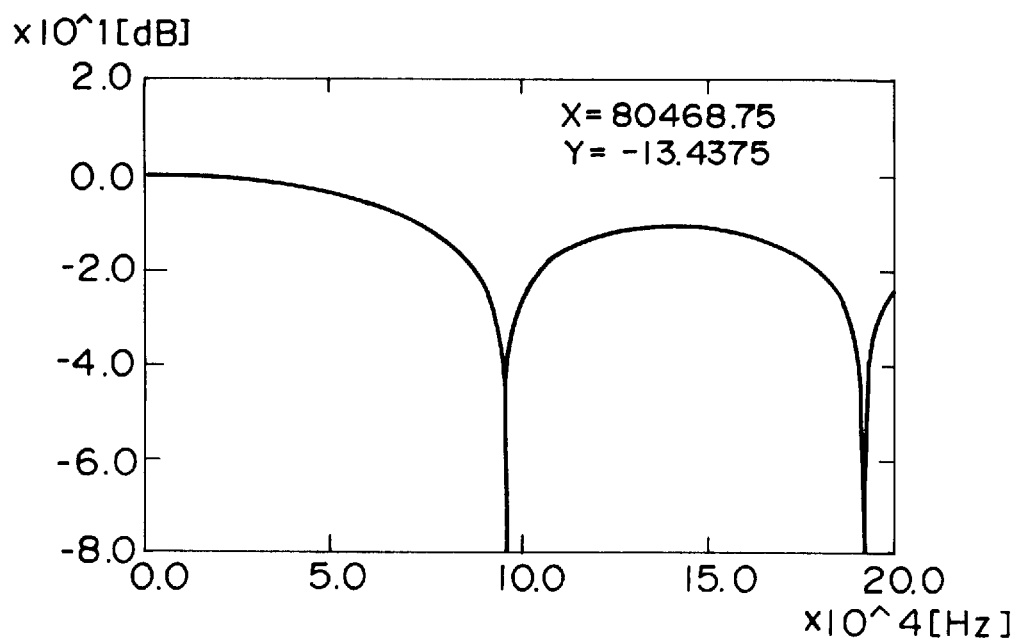
FIG. 13 is a characteristic diagram showing a relationship between the frequency and gain of the transer function HL(z) in the fifth embodiment of the present invention.
Figure 14:
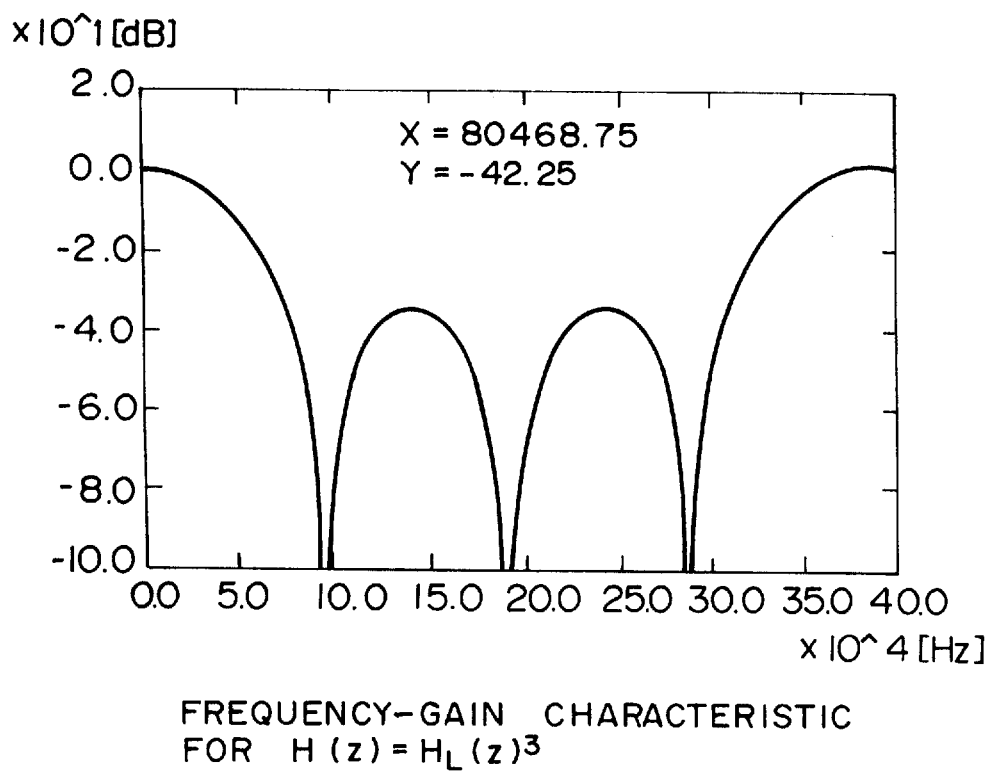
FIG. 14 is a characteristic diagram showing a relationship between the frequency and gain of a transfer function H(z) in the fifth embodiment of the present invention.

A fifth embodiment of the present invention will next be explained by referring to a block diagram of FIG. 11. In the modulation circuit of the fifth embodiment, a 12-bit digital band pass send signal having a sampling frequency of 64 kHz and a band width of 16 kHz is subjected to a frequency conversion to a digital band pass send signal having a sampling frequency of 96 MHz (=384 kHz×250) and a center frequency of 24 MHz, subjected to a D/A conversion, and then passed through a BPF having a center frequency of 24 MHz to obtain an analog send signal. In the fifth embodiment, a digital band pass send signal is interpolated by a digital filter having the transfer function H(z) expressed by an equation (3) to obtain a signal having a sampling frequency of 384 kHz, multiplied by 1, 0, −1, 0, 1, . . . to obtain a 12-bit digital band pass send signal having a center frequency of 96 kHz, and then subjected to the frequency conversion by the frequency conversion circuit of the first embodiment. Although the conversion ratio of the sampling frequency based on the equation (2) is limited to a multiple of the power of 2 in the third embodiment, the sampling frequency conversion of an integer multiple is possible in the equation (3).

$$H(z) = HL(z)*HL(z)*HL(z) \quad (3)$$

$$HL(z) = \frac{1-z^{-6}}{1-z^{-1}} = 1 + z^{-1} + z^{-2} + z^{-4} + z^{-6}$$

where $z^{-1}$ denotes a delay of $(384 \text{ kHz})^{-1}$ FIG. 12 is a waveform of impulse response to a transfer function HL(z), FIG. 13 is a frequency-gain characteristic diagram for the transfer function HL(z), and FIG. 14 is a frequency-gain characteristic diagram for the transfer function H(z). The present filter is a low pass filter (LPF) and a harmonic spectrum corresponding to an integer multiple of 64 kHz corresponds to notch frequencies of the H(z), the input signal is attenuated by an amount of 70 dB or more.

Figure 11:
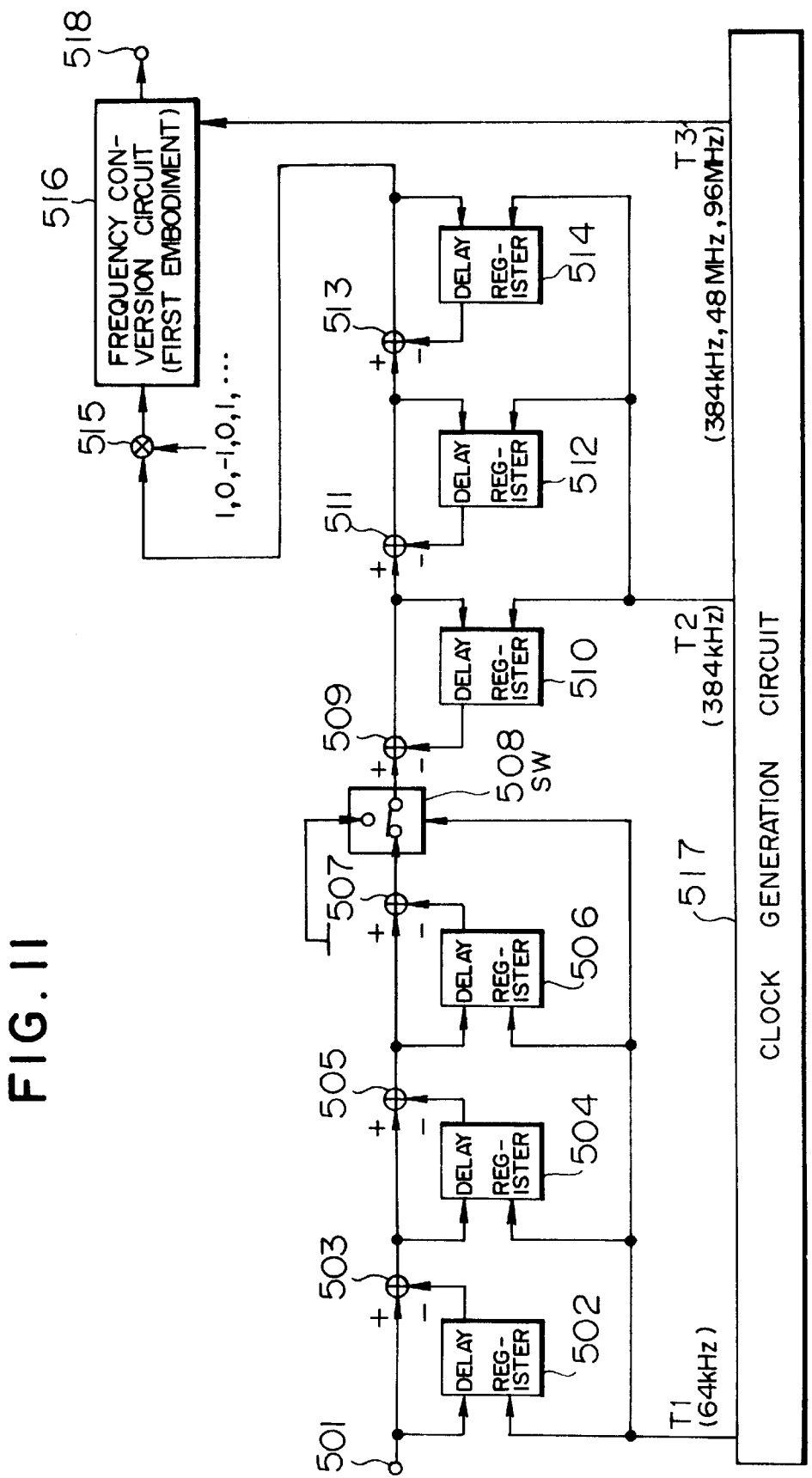
FIG. 11 is a block diagram of an arrangement of a part of a modulation circuit in accordance with a fifth embodiment of the present invention.

In FIG. 11, reference numeral 501 denotes an 10 input terminal 501 for input of digital band pass send signal, numeral 502 denotes a 12-bit delay register, 503 denotes a 13-bit subtractor, and 518 denotes an analog modulated wave output terminal. The input terminal 501 is connected to the delay register 502, subtractor 503 and analog modulated wave output terminal 518. The delay register 502 is connected to the input terminal 501, subtractor 503 and analog modulated wave output terminal 518. Numeral 504 denotes a 12-bit delay register, and 505 denotes a 14-bit subtractor. The subtractor 503 is connected to the input terminal 501, delay register 502, delay register 504 and subtractor 505. Numeral 517 denotes a clock generation circuit. The delay register 504 is connected to the subtractor 503, subtractor 505 and clock generation circuit 517. Numeral 506 denotes a 14-bit delay register, and 507 denotes a 14-bit subtractor. The subtractor 505 is connected to the subtractor 503, delay register 504, delay register 506 and subtractor 507. The delay register 506 is connected to the subtractor 505, subtractor 507 and clock generation circuit 517. Numeral 508 denotes a switch (SW). The subtractor 507 is connected to the subtractor 505, delay register 506, switch 508 and clock generation circuit 517. Numeral 509 denotes a 16-bit subtractor. The switch 508 is connected to the subtractor 507, subtractor 509 and clock generation circuit 517. Numeral 510 denotes a 16-bit delay register, and 511 denotes a 17-bit subtractor. The subtractor 509 is connected to the switch 508, delay register 510 and subtractor 511. The delay register 510 is connected to the subtractor 509, subtractor 511 and clock generation circuit 517. Numeral 512 denotes a 17-bit delay register, and 513 denotes a 18-bit subtractor. The subtractor 511 is connected to the delay register 510, delay register 512 and subtractor 513. The delay register 512 is connected to the subtractor 511, subtractor 513 and clock generation circuit 517. Numeral 514 denotes a 18-bit delay register, and 515 denotes a multiplier. The subtractor 513 is connected to the delay register 512, delay register 514 and multiplier 515. The delay register 514 is connected to the subtractor 513, multiplier 515 and clock generation circuit 517. Numeral 516 denotes a frequency conversion circuit in the first embodiment. The multiplier 515 is connected to the subtractor 513, delay register 514 and frequency conversion circuit 516. The frequency conversion circuit 516 is connected to the multiplier 515, clock generation circuit 517 and analog modulated wave output terminal 518. The clock generation circuit 517 is connected to the delay register 502, delay register 504, delay register 506, switch 508, delay register 510, delay register 512, delay register 514 and frequency conversion circuit 516. The analog modulated wave output terminal 518 is connected to the frequency conversion circuit 516.

The operation of the present embodiment will then be explained. In FIG. 11, when receiving one sample from the input terminal 501 at a rising edge of the 64 kHz clock signal from the clock generation circuit 517, the subtractor 503 subtracts contents of the delay register 502 from the input signal, the subtractor 505 subtracts contents of the delay register 504 from an output of the subtractor 503, the subtractor 507 subtracts contents of the delay register 506 from an output of the subtractor 505 and outputs its subtraction result to the switch 508, such that, at a falling edge of the 64 kHz clock signal, an output of the subtractor 505 is applied to the delay register 506, the output of the subtractor 503 is to the delay register 504, and the input signal of the input terminal 501 is to the delay register 502. The switch 508 outputs the output of the subtractor 507 for a time corresponding to one clock of the 384 kHz clock signal from the rising edge of the 64 kHz clock signal, but outputs 0 for a time corresponding to the remaining 5 clocks thereof for 384 kHz sampling output. Further, at a rising edge of the 384 kHz clock signal from the clock generation circuit 517, the subtractor 509 subtracts the contents of the delay register 510 from the output of the switch 508, the subtractor 511 subtracts the contents of the delay register 512 from the output of the subtractor 509, the subtractor 513 subtracts the contents of the delay register 514 from the output of the subtractor 511, the multiplier 515 multiplies the output of the subtractor 513 by $\{j^n+(-j)^n\}/2=1, 0, -1, 0, 1, \ldots$, such that, at a falling edge of the 384 kHz clock signal, the output of the subtractor 509 is applied to the delay register 510, the output of the subtractor 511 is to the delay register 512, the output of the subtractor 513 is to the delay register 514. Since the multiplier 515 outputs a band pass signal having a sampling frequency of 384 kHz and a center frequency of 24 MHz, the frequency conversion circuit 516 located downstream of the multiplier 515 outputs an analog send signal through an analog BPF having a center frequency of 24 MHz.

As mentioned above, in accordance with the fifth embodiment of the present invention, the digital band pass send signal is interpolated through the digital filter in the preceding stage to obtain a band pass signal having a sampling frequency of 384 kHz and a center frequency of 24 MHz, and the frequency conversion circuit in the first embodiment is employed in the latter stage, with the result that the modulation circuit can be made small in size and to have an adjustment-free structure. Further, though the sampling frequency conversion ratio of the digital band pass send signal is limited to a multiple of the power of 2 in the third embodiment, the sampling conversion corresponding to an integer multiple is possible in the fifth embodiment.

(Sixth Embodiment)

A sixth embodiment of the present invention will be explained by referring to a block diagram of FIG. 15. In the modulation circuit of the present embodiment, a 12-bit digital band pass send signal having a sampling frequency of 64 kHz and a band width of 16 kHz is subjected to a frequency conversion to a digital band pass send signal having a sampling frequency of 96 MHz (=384 kHz×250) and a center frequency of 24 MHz, and then passed through a BPF having a center frequency of 24 MHz to obtain an analog send signal. In the present embodiment, the input signal is converted by a circuit similar to that in the fifth embodiment to a 12-bit digital band pass send signal having a sampling frequency of 384 kHz and a center frequency of 96 kHz in the preceding stage, and then subjected by the frequency conversion circuit of the second embodiment to a frequency conversion in the latter stage.

Figure 15:
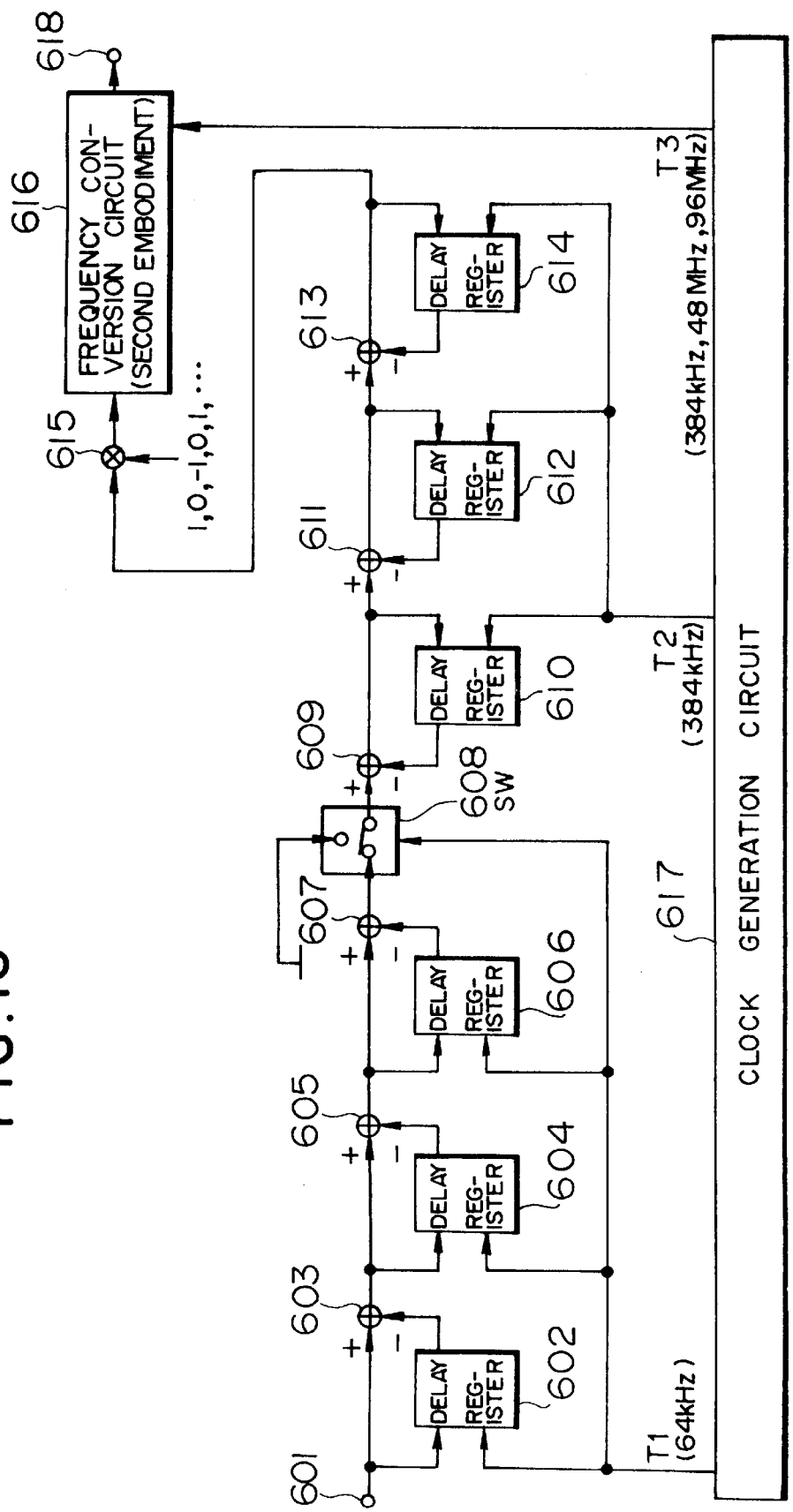
FIG. 15 is a block diagram of an arrangement of a modulation circuit in accordance with a sixth embodiment of the present invention.
Figure 16:
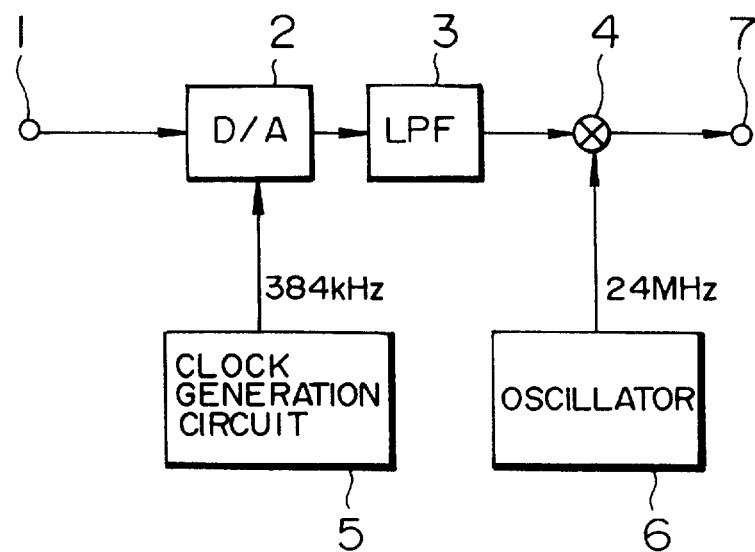
FIG. 16 is a block diagram of an arrangement of a prior art modulation circuit.

In FIG. 15, reference numeral 601 denotes an input terminal 601 for input of digital band pass send signal, numeral 602 denotes a 12-bit delay register, 603 denotes a 13-bit subtractor, and 617 denotes a clock generation circuit. the input terminal 601 is connected to the delay register 602, subtractor 603 and clock generation circuit 617. The delay register 602 is connected to the input terminal 601, subtractor 603 and clock generation circuit 617. Numeral 604 denotes a 13-bit delay register, and 605 denotes a 14-bit subtractor. The subtractor 603 is connected to the input terminal 601, delay register 602, delay register 604 and subtractor 605. The delay register 604 is connected to the subtractor 603, subtractor 605 and clock generation circuit 617. Numeral 606 denotes. a 14-bit delay register, 607 denotes a 15-bit subtractor. The subtractor 605 is connected to the subtractor 603, delay register 604, delay register 606 and subtractor 607. The delay register 606 is connected to the subtractor 605, subtractor 607 and clock generation circuit 617. Numeral 608 denotes a switch (SW) for insertion of 0 signal. The subtractor 607 is connected to the subtractor 605, delay register 606, switch 608 and clock generation circuit 617. Numeral 609 denotes a 16-bit subtractor. The switch 608 is connected to the subtractor 607, subtractor 609 and clock generation circuit 617. Numeral 610 denotes a 16-bit delay register and 611 denotes a 17-bit subtractor. The subtractor 609 is connected to the switch 608, delay register 610 and subtractor 611. The delay register 610 is connected with the subtractor 609, subtractor 611 and clock generation circuit 617. Numeral 612 denotes a 17-bit delay register and 613 denotes a 18-bit subtractor. The subtractor 611 is connected with the delay register 610, delay register 612 and subtractor 613. The delay register 612 is connected with the subtractor 611, subtractor 613 and clock generation circuit 617. Numeral 614 is a 18-bit delay register and 615 denotes a multiplier. The subtractor 613 is connected with the delay register 612, delay register 614 and multiplier 615. The delay register 614 is connected with the subtractor 613, multiplier 615 and clock generation circuit 617. Numeral 616 is a frequency conversion circuit of the second embodiment. The multiplier 615 is connected with the subtractor 613, delay register 614 and frequency conversion circuit 616. Numeral 618 is a analog modulated wave output terminal. The frequency conversion circuit 616 is connected with the multiplier 615, clock generation circuit 617 and analog modulated wave output terminal 618. The clock generation circuit 617 is connected with the delay register 602, delay register 604, delay register 606, switch 608, delay register 610, delay register 612, delay register 614 and frequency conversion circuit 616. The analog modulated wave output terminal 618 is connected with the frequency conversion circuit 616.

In the operation of the embodiment of the present invention of FIG. 15, when receiving one sample from the input terminal 601 at a rising edge of the 64 kHz clock signal from the clock generation circuit 617, the subtractor 603 subtracts contents of the delay register 602 from the input signal, the subtractor 605 subtracts contents of the delay register 604 from an output of the subtractor 603, the subtractor 607 subtracts contents of the delay register 606 from an output of the subtractor 605 and outputs its subtraction result to the switch 608, such that, at a falling edge of the 64 kHz clock signal, an output of the subtractor 605 is applied to the delay register 606, the output of the subtractor 603 is to the delay register 604, and the input signal of the input terminal 601 is to the delay register 602. The switch 608 outputs the output of the subtractor 607 for a time corresponding to one clock of the 384 kHz clock signal from the rising edge of the 64 kHz clock signal, but outputs 0 for a time corresponding to the remaining 5 clocks thereof for 384 kHz sampling output. Further, at a rising edge of the 384 kHz clock signal from the clock generation circuit 617, the subtractor 609 subtracts the contents of the delay register 610 from the output of the switch 608, the subtractor 611 subtracts the contents of the delay register 612 from the output of the subtractor 609, the subtractor 613 subtracts the contents of the delay register 614 from the output of the subtractor 611, the multiplier 615 multiplies the output of the subtractor 613 by $\{j^n+(-j)^n\}/2=1, 0, -1, 0, 1, \ldots$, such that, at a falling edge of the 384 kHz clock signal, the output of the subtractor 609 is applied to the delay register 610, the output of the subtractor 611 is to the delay register 612, the output of the subtractor 613 is to the delay register 614. Since the multiplier 615 outputs a band pass signal having a sampling frequency of 384 kHz and a center frequency of 24 MHz, the frequency conversion circuit 616 located downstream of the multiplier 615 outputs an analog send signal through an analog BPF having a center frequency of 24 MHz.

As mentioned above, in accordance with the sixth embodiment of the present invention, the digital band pass send signal is interpolated through the digital filter in the preceding stage to obtain a band pass signal having a sampling frequency of 384 kHz and a center frequency of 24 MHz, and the frequency conversion circuit in the second embodiment is employed in the latter stage, with the result that the modulation circuit can be made small in size and to have an adjustment-free structure. Further, the use of the frequency conversion circuit of the second embodiment enables suppression of the D/A conversion speed and realization of a low power consumption.

As has been explained in the foregoing, in accordance with the present invention, when the digital band pass send signal is interpolated to make the sampling frequency high, the characteristic curve of the interpolating filter after the D/A conversion can be made gentle and thus the circuit can be made small in size. Further, one of frequencies of the harmonic spectrum corresponding to an integer multiple of the sampling frequency is extracted during the interpolation of the digital band pass send signal, frequency-converted to the band pass signal and then subjected to a D/A conversion. As a result, a D.C. offset voltage applied later to an operational amplifier can be prevented from causing deterioration of the modulated wave, e.g., carrier leak and thus an adjustment-free circuit can be realized. When the digital filter for performing the above interpolation and frequency conversion is of a delay-distortion-free, rectangular impulse response type which is arranged in the form of a sum of series indicative of the transfer function of the filter, the filter can be implemented with use of delay circuits and adders/subtractors other than multipliers and the numerator part of the transfer function can operate with a low-speed clock signal, which results in that, when compared to the arrangement of an ordinary filter based on sum and accumulated calculation, the numbers of delay circuits and adders/subtractors can be remarkably reduced and accordingly the miniaturization and low power consumption of the circuit can be realized. Since multiplication is unnecessary and a less number of adders and subtractors is required, the filter calculation can be executed based on integer calculation without any calculation errors only by increasing the word length of the adders/subtractors by (log 2A) bits (A being the number of adders and subtractors).

Although the modulation circuit has been implemented in a hardware manner in any of the foregoing embodiments of the present invention, the parts of the modulation circuit corresponding to the generation and interpolation of the base-band signal with a low sampling frequency as well as the low-speed operational part (numerator part of the transfer function) of the frequency conversion circuit may be implemented in a software manner using a digital signal processor (DSP) or the like. In the latter case, since the DSP as an additional circuit is required only for the high-speed operational part (denominator part of the transfer function) of the frequency conversion circuit, the circuit can be miniaturized. Further, even when it is desired, in some cases, to execute the circuit by switching between a plurality of types of modulation systems and between a plurality of sorts of transmission rates, the additional circuit can be commonly used only by switching the DSP software, thus realizing miniaturization of the circuit.

What is claimed is:

1. A frequency conversion circuit comprising:

an input terminal for having applied thereto a digital band pass send signal having a sampling frequency $f_{s2}$ and a center frequency $f_{s2}/4$;

first digital filter means for deriving, from the digital band pass send signal applied to the input terminal, with the sampling frequency $f_{s2}$, a numerator of a transfer function $HB(z)^{N2}$ obtained from a cascade connection of transfer functions $HB(z)$, wherein N2 is an integer;

second digital filter means for deriving, from said numerator, with a sampling frequency $f_{s3}=L*f_{s2}$, L being an odd integer, a denominator of the transfer function $HB(z)^{N2}$;

the first and second digital filter means operating on the digital band pass send signal to perform an L-time interpolation and a higher harmonic component extraction having a center frequency of $f_{s3}/4$;

a D/A converter, receiving said numerator from the first digital filter means and said denominator from the second digital filter means, for converting the numerator and the denominator into a sample value signal; and analog band pass filter means for converting the sample value signal from the D/A converter into an analog send signal HB(z), wherein:

$$HB(z) = \frac{1-(-z^{-2})^L}{1+z^{-2}}$$
$$= 1 - z^{-2} + z^{-4} - \ldots + (-z^{-2})^{L-1}$$

where $z^{-1}$ denotes a delay of $1/f_{s3}$.

2. A frequency conversion circuit comprising:

an input terminal for having applied thereto a digital band pass send signal having a sampling frequency $f_{s2}$ and a center frequency $f_{s2}/4$;

digital filter means for deriving, from the digital band pass send signal applied to the input terminal, with the sampling frequency fs2, a numerator of a function $HB(z)^{N2}$ (N2 being an integer) obtained from a cascade connection of transfer functions $HB(z)$;

a D/A converter, receiving said numerator from the digital filter means, for converting the numerator into a sample value signal;

switched capacitor filter means for deriving, from the sample value signal, with a sampling frequency $f_{s3}=L*f_{s2}$, L being an odd integer, a denominator of the function $HB(z)^{N2}$;

the digital filter means and the switched capacitor filter means operating on the digital band pass send signal to perform an L-time interpolation and a higher harmonic component extraction having a center frequency of $f_{s3}$; and analog band pass filter means for converting an output of the switched capacitor filter means into an analog send signal HB(z), wherein:

$$HB(z) = \frac{1-(-z^{-2})^L}{1+z^{-2}}$$
$$= 1 - z^{-2} + z^{-4} - \ldots + (-z^{-2})^{L-1}$$

where $z^{-1}$ denotes a delay of $1/f_{s3}$.

3. A frequency conversion circuit comprising:

an input terminal for having applied thereto a digital band pass send signal having a sampling frequency $f_{s1}$;

first digital filter means for deriving, from the digital band pass send signal, with the sampling frequency $f_{s1}$, a numerator of a function $HB(z)^{N1}$ obtained from a cascade connection of transfer functions $HB(z)$, N1 being an integer, where $HB(z)$ is given by $$HB(z) = \frac{1-(-z^{-2})^L}{1+z^{-2}}$$
$$= 1 - z^{-2} + z^{-4} - \ldots + (-z^{-2})^{L-1}$$

and L has a first value L1;

second digital filter means for deriving, from the numerator derived by the first digital filter means, with a sampling frequency $f_{s2}=L1*f_{s1}$, a denominator of the function $HB(z)^{N1}$ wherein L has said first value L1;

the first and second digital filter means operating on the digital band pass send signal to perform an L1-time interpolation and a higher harmonic component extraction having a center frequency $f_{s2}/4$;

third digital filter means for deriving, from the numerator and the denominator derived by the first and second digital filter means, with the sampling frequency $f_{f2}$, a numerator of a function $HB(z)^{N2}$ obtained from a cascade connection of said transfer functions $HB(z)$, N2 being an integer, wherein L has a second value L2;

fourth digital filter means for deriving, from the numerator derived by the third digital filter means, with a sampling frequency $f_{s3}=L2*f^{s2}$, a denominator of the function $HB(z)^{N2}$, wherein L has said second value L2;

the third and fourth digital filter means operating on the digital band pass send signal to perform an L2-time interpolation and a higher harmonic component extraction having a center frequency $f_{s3}/4$;

a D/A converter, receiving the numerator derived by the third digital filter means and the denominator derived by the fourth digital filter means, for converting the numerator derived by the third digital filter means and the denominator derived by the fourth digital filter means into a sample value signal; and analog band pass filter means for converting the sample value signal from the D/A converter into an analog send signal HB(z), wherein L is an odd number and $z^{-1}$ denotes a delay of $1/f_{s3}$.

4. A frequency conversion circuit comprising:

an input terminal for having a digital band pass send signal having a sampling frequency $f_{s1}$ applied to the input terminal;

first digital filter means for deriving, from the digital band pass send signal, with the sampling frequency $f_{s1}$, a numerator of a function $HB(z)^{N1}$ obtained from a cascade connection of transfer functions $HB(z)$, N1 being an integer, where $HB(z)$ is given by $$HB(z) = \frac{1-(-z^{-2})^L}{1+z^{-2}}$$

$$= 1 - z^{-2} + z^{-4} - \ldots + (-z^{-2})^{L-1}$$

and L has a first value L1;

second digital filter means for deriving, from the numerator derived by the first digital filter means, with a sampling frequency $f_{s2}=L1*f_{s1}$, a denominator of the function $HB(z)^{N1}$ wherein L has said first value L1 which is a power of 2 equal to or greater than 4;

the first and second digital filter means operating on the digital band pass send signal to perform an L1-time interpolation and a higher harmonic component extraction having a center frequency $f_{s2}/4$;

third digital filter means for deriving, from the numerator and the denominator derived by the first and second digital filter means, with the sampling frequency $f_{f2}$, a numerator of a function $HB(z)^{N2}$ obtained from a cascade connection of said transfer functions HB(z), N2 being an integer, wherein L has a second value L2;

a D/A converter, receiving the numerator derived by the third digital filter means, for converting the numerator derived by the third digital filter means into a sample value signal;

switched capacitor filter means for deriving, from the sample value signal, with a sampling frequency $f_{s3}=L2*f_{s2}$, a denominator of the function $(HB(z))_{N2}$, wherein L has said second value L2;

the third digital filter means and the switched capacitor filter means operating on the digital band pass send signal to perform an L2-time interpolation and a higher harmonic component extraction having a center frequency $f_{s3}$;

analog band pass filter means for converting the sample value signal into an analog send signal HB(z), wherein L is an odd number and $z_1$ denotes a delay of $1/f_{s3}$.

5. A frequency conversion circuit comprising:

an input terminal for having applied thereto a digital base band send signal having a sampling frequency $f_{s1}$;

first digital filter means for deriving, from the digital base band send signal, with the sampling frequency $f_{s1}$, a numerator of a function $HL(z)^{N1}$ obtained from a cascade connection of transfer functions HL(z), N1 being an integer, wherein L has a first value L1;

second digital filter means for deriving, from the numerator derived by the first digital filter means, with a sampling frequency $f_{s2}=L1*f_{s1}$, a denominator of said function $(HL(z))^{N1}$;

the first and second filter means operating to subject the digital base band send signal to an L1-time interpolation;

a multiplier circuit, receiving the numerator derived by the first digital filter means and the denominator derived by the second digital filter means, for deriving a digital band pass send signal having the sampling frequency $f_{s2}$ and a center frequency $f_{s2}/4$, the multiplier circuit multiplying the numerator derived by the first digital filter means and denominator derived by the second digital filter means by $\{j^n+(-j)^n\}/2$ (j: complex number)=1, 0, −1, 0, 1, . . . ;

third digital filter means for deriving, from the digital band pass send signal derived by the multiplier circuit, with the sampling frequency $f_{s2}$, a numerator of a function $HB(z)^{N2}$ obtained from a cascade connection of transfer functions HB(z), N2 being an integer and L having a second value L2 which is odd;

fourth digital filter means for deriving, from the numerator derived by the third digital filter means, with a sampling frequency $f_{s3}=L2*f_{s2}$, a denominator of the transfer function $HB(z)^{N2}$, wherein L has said second value L2;

the third and fourth digital filter means operating on the digital band pass send signal to perform an L2-time interpolation and a higher harmonic component extraction having a center frequency of $f_{s3}/4$;

a D/A converter for converting the numerator derived by the third digital filter means and the denominator derived by the fourth digital filter means into a sample value signal; and analog band pass filter means for converting the sample value signal into an analog send signal HB(z); wherein HB(z) and HL(z) are given by:

$$HB(z) = \frac{1-(-z^{-2})^L}{1+z^{-2}}$$

$$= 1 - z^{-2} + z^{-4} - \ldots + (-z^{-2})^{L-1}$$

where L is an odd integer and $z^{-1}$ denotes a delay of $1/f_{s3}$; and $$HL(z) = \frac{1-z^{-L}}{1+z^{-1}}$$

$$= 1 - z^{-1} + z^{-2} - \ldots + z^{-(L-1)}$$

where L is an integer and $z^{-1}$ denotes a delay of $1/f_2$.

6. A frequency conversion circuit comprising:

an input terminal for having applied thereto a digital base band send signal having a sampling frequency $f_{s1}$;

first digital filter means for deriving, from the digital base band send signal applied to the input terminal, with the sampling frequency $f_{s1}$, a numerator of a function $HL(z)^{N1}$ obtained from a cascade connection of transfer functions HB(z), N1 being an integer, wherein L has a first value L1;

second digital filter means for deriving, from the numerator derived by the first digital filter means, with a sampling frequency $f_{s2}$, a denominator of the function $(HL(z))^{N1}$;

the first and second digital filter means operating on the digital base band send signal to perform an L1-time interpolation;

a multiplier circuit for converting the numerator derived by the first digital filter means and the denominator derived by the second digital filter means into a digital band pass send signal having the sampling frequency $_{s2}$ and a center frequency $f_{s2}/4$, the multiplier circuit multiplying the numerator derived by the first digital filter means and the denominator derived by the second digital filter means by $\{j^n+(-j)^n\}/2$ (j: complex number) =1, 0, −1, 0, 1, . . . ;

third digital filter means for deriving from the digital band pass send signal, with the sampling frequency $f_{s2}$, a numerator of a function $HB(z)^{N2}$ obtained by a cascade connection of transfer functions $HB(z)$, N2 being an integer, wherein L has a second value L2;

a D/A converter for converting the numerator derived by the third digital filter means into a sample value signal;

switched capacitor filter means for deriving, from the sample value signal, with a sampling frequency $f_{s3} = L2*f_{s2}$, a denominator of the function $HB(z)^{N2}$, wherein L has said second value L2;

the switched capacitor means operating on the sample value signal to perform an L2-time interpolation and a higher harmonic component extraction having a center frequency of $f_{s3}$; and analog band pass filter means for converting the sample value signal into an analog send signal $HB(z)$; wherein:

$$HB(z) = \frac{1-(-z^{-2})^L}{1+z^{-2}}$$
$$= 1 - z^{-2} + z^{-4} - \ldots + (-z^{-2})^{L-1}$$

where L is an odd number and $z^{-1}$ denotes a delay of $1/f_{s3}$; and $$HL(z) = \frac{1-z^{-L}}{1+z^{-1}}$$
$$= 1 - z^{-1} + z^{-2} - \ldots + z^{-(L-1)}$$

where L is an integer and $z_{-1}$ denotes a delay of $1/f_{s2}$.

* * * * *